(12) United States Patent
Mochizuki

(10) Patent No.: US 6,847,039 B2
(45) Date of Patent: Jan. 25, 2005

(54) PHOTODETECTING DEVICE, RADIATION DETECTING DEVICE, AND RADIATION IMAGING SYSTEM

(75) Inventor: Chiori Mochizuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 278 days.

(21) Appl. No.: 10/102,647

(22) Filed: Mar. 22, 2002

(65) Prior Publication Data

US 2002/0145117 A1 Oct. 10, 2002

(30) Foreign Application Priority Data

Mar. 28, 2001 (JP) .......................................... 2001-093002
May 11, 2001 (JP) .......................................... 2001-142005

(51) Int. Cl.$^7$ ................................................. G01T 1/24
(52) U.S. Cl. ............................. 250/370.09; 250/370.11
(58) Field of Search ......................... 250/370.09, 370.11

(56) References Cited

U.S. PATENT DOCUMENTS

| 5,262,649 A | 11/1993 | Antonuk et al. ....... 250/370.09 |
| 5,641,974 A | 6/1997 | den Boer et al. ............. 257/59 |
| 5,965,872 A | 10/1999 | Endo et al. ............... 250/208.1 |
| 6,011,274 A | * 1/2000 | Gu et al. ....................... 257/59 |

FOREIGN PATENT DOCUMENTS

| EP | 0 936 660 | 8/1999 |
| EP | 964451 A2 | * 12/1999 |
| WO | WO 00/10194 | 2/2000 |

OTHER PUBLICATIONS

U.S. Appl. No. filed, Sep. 16, 1999, inventor Chiori Mochizuki.

* cited by examiner

*Primary Examiner*—Constantine Hannaher
*Assistant Examiner*—Shun Lee
(74) *Attorney, Agent, or Firm*—Fitzpatrick, Cella, Harper & Scinto

(57) ABSTRACT

To improve the effective aperture ratio of a pixel, achieve higher sensitivity, and to realize higher definition without causing the degradation of performance of gate wiring, a signal line, and a switching TFT that are indispensable in constructing a pixel. A photodetecting device is provided, in which a plurality of pixels including photoelectric conversion elements that convert incident light into electrical signals are formed on a substrate, in which wiring connected to the pixels including the photoelectric conversion elements is arranged on an insulating layer, which has been formed so as to cover the substrate and the photoelectric conversion element, and on a space between at least two adjacent photoelectric conversion elements.

14 Claims, 22 Drawing Sheets

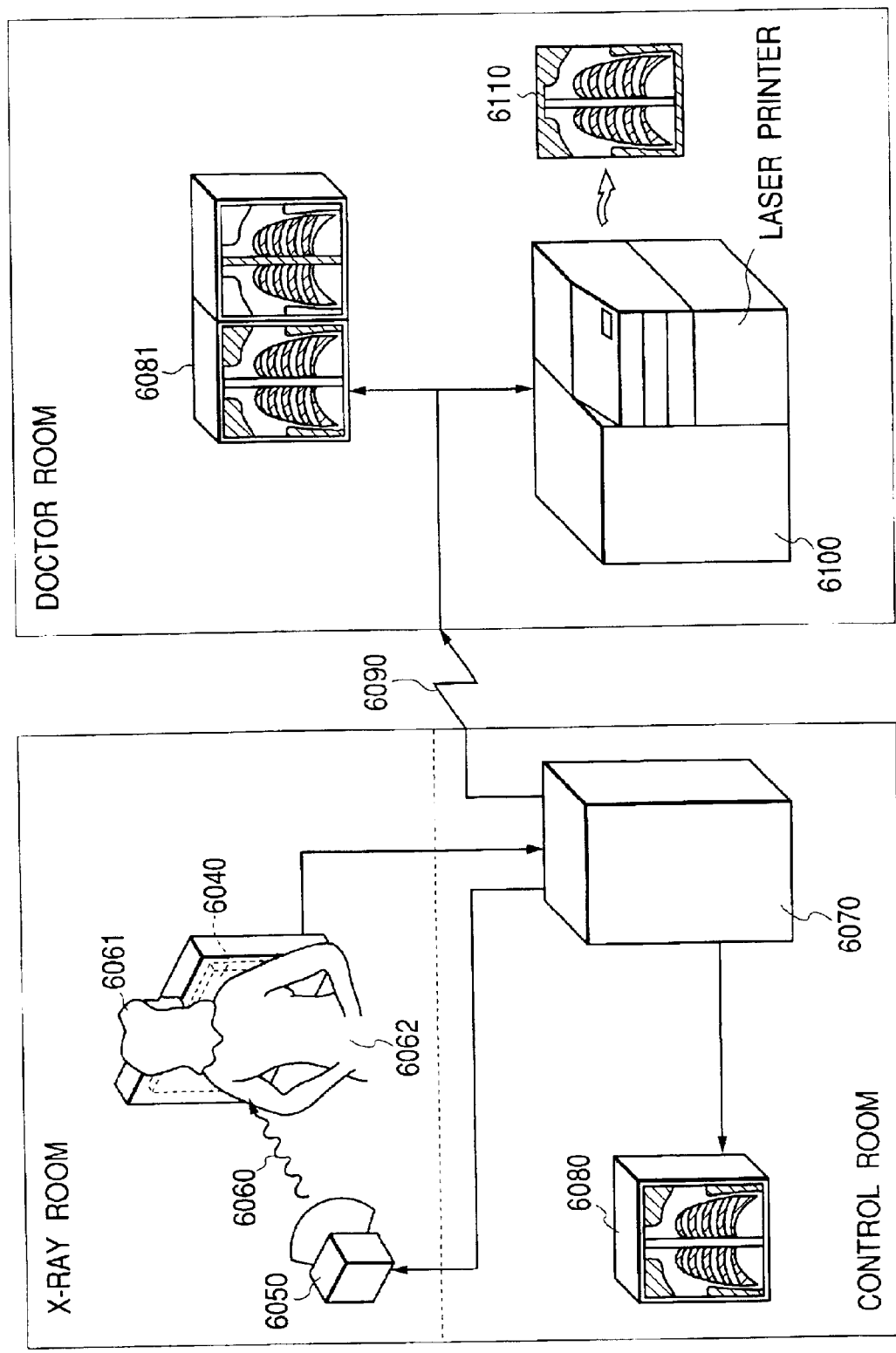

FIG. 32
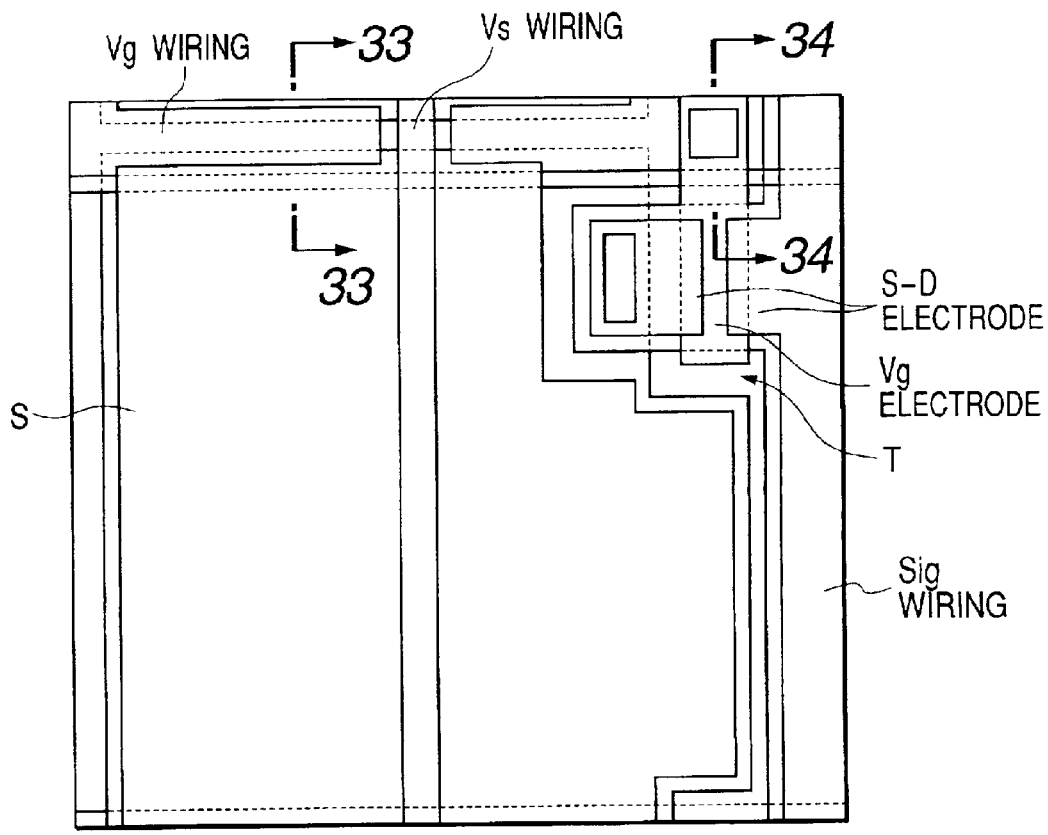
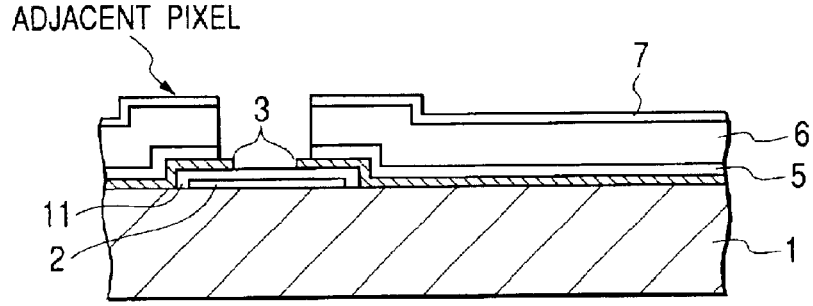
FIG. 33
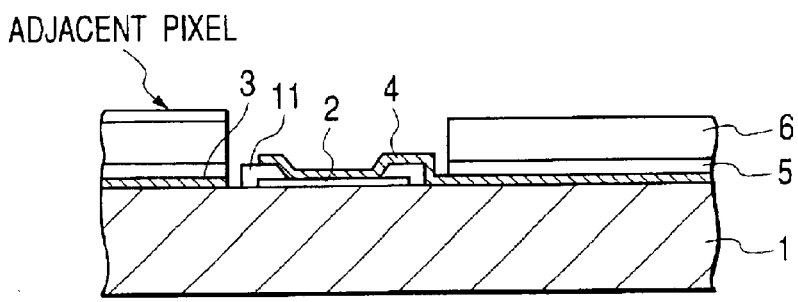
FIG. 34

PHOTODETECTING DEVICE, RADIATION DETECTING DEVICE, AND RADIATION IMAGING SYSTEM

BACKGROUND OF THE INVENTION

1. Field of the Invention

The present invention relates to a photodetecting device, a radiation detecting device, and a radiation imaging system having the photodetecting device and the radiation detecting device. More specifically, the present invention relates to a technique that is suitably used for a radiation detecting device for detecting radiation, such as x-rays or γ-rays, and is applied to a medical image diagnosing apparatus, a nondestructive inspecting apparatus, an analyzing apparatus that uses radiation, or the like.

2. Related Background Art

In recent years, as a radiation detecting device that detects radiation, such as x-rays or γ-rays, there has been used a so-called indirect-type radiation detecting device that converts radiation into visible light and detects the visible light with using a photoelectric conversion element that uses an amorphous silicon thin film. As a main reason why the radiation detecting device of this type is commercialized, there is cited a fact that the advancement of a liquid crystal technology, whose core is amorphous silicon having photoconductivity, makes it possible to increase the areas of TFTs (Thin Film Transistors) and photosensors. Another main reason is that the combination with GOS phosphor, CsI phosphor, or the like, which have conventionally been used, makes it possible to produce, with stability, a radiation detecting device that has a large screen and a high degree of reliability.

As a typical example of the radiation detecting device of this type, there has conventionally been used a radiation detecting device in which the phosphor described above is combined with a photosensor array in which there are arranged a plurality of pixels that each have an MIS-TFT structure constructed of a switching TFT and an MIS-type photoelectric conversion element proposed by the inventors of the present invention. The feature of the photosensor array in this example is that it is possible to manufacture the switching TFT and MIS-type photoelectric conversion element described above in the same layer through the same process. As a result, there is obtained an advantage that it becomes possible to produce the photosensor array with stability and at low cost.

Meanwhile, there are also proposed various other photosensor arrays, such as a photosensor array in which there are arranged a plurality of pixels that each have a PIN-TFT structure obtained by combining a PIN-type photoelectric conversion element with a switching TFT or a photosensor array in which there are arranged a plurality of pixels that each have a PIN-PIN structure obtained by using a PIN-type diode for a switch element. As a matter of principle, these photosensor arrays generally use a common driving method with which radiation is converted into visible light using a phosphor, the visible light is stored as accumulated charges by a photoelectric conversion element, and the charges are read in succession by a switch element.

FIG. 14 shows a schematic equivalent circuit of a photosensor array that is used for a general radiation detecting device. In this drawing, to simplify the explanation, there is used, as an example, a photosensor array constructed of a 3-by 3-pixel matrix that has nine pixels in total.

Each pixel is constructed of one photoelectric conversion element $S_{ij}$ (i, j=1 to 3), one switching TFT $T_{ij}$ (i, j=1 to 3), and the like. In this example, as to the photoelectric conversion element $S_{ij}$, there is not drawn a distinction between the aforementioned MIS type and PIN type in this drawing. Also, in FIG. 14, reference symbol $Vs_n$ (n=1 to 3) represents bias wiring of a photoelectric conversion element that is connected to a bias power source B. Reference symbol $Vg_n$ (n=1 to 3) represents the gate wiring of a switching TFT and reference symbol $Sig_n$ (n=1 to 3) represents a signal line. The signal output from each photoelectric conversion element $S_{ij}$ is accumulated in the photoelectric conversion element $S_{ij}$ itself. Then, according to the output signal from a driving circuit D, the switching TFTs $T_{ij}$ are turned on in succession and currents corresponding to the accumulated charges accumulated in the photoelectric conversion element $S_{ij}$ itself flow to the signal line $Sig_n$ (n=1 to 3). The signal read in this manner is inputted into a signal processing circuit A, which then amplifies, A/D-converts and outputs the signal as an output signal.

FIG. 15 is a schematic plan view of one pixel of the MIS-TFT structure. FIG. 15 is a diagram taken from a side on which there are arranged a source-drain electrode and the like under a condition where a phosphor is not yet bonded. Each solid line represents a portion that can be viewed from a side on which a signal line is arranged, while each dotted line indicates a portion that cannot be viewed therefrom.

In FIG. 15, one pixel includes: a photoelectric conversion element constructed of a sensor section 50, a lower electrode 3, and bias wiring 8; a switching TFT constructed of a gate electrode 4, a source-drain electrode 9, and the like; gate wiring 2 that is the gate wiring of the switching TFT; a signal line 10 that is a signal line for transferring an electronic signal converted by the photoelectric conversion element; and a contact hole 12 for electrically connecting the source-drain electrode 9 of the switching TFT to the lower electrode of the photoelectric conversion element.

FIG. 16 is a schematic cross-sectional view of the above described one pixel. FIG. 16 is a drawing in which a cross-sectional view of each device taken in an arbitrary direction is arranged to explain the layer construction of each device, such as the gate wiring, the photoelectric conversion element, the switching TFT, and the signal line shown in FIG. 15. Note that the order in which each layer is constructed is the same as that in FIG. 15.

In FIG. 16, reference numeral 1 denotes a glass substrate, numeral 3 the lower electrode of the photoelectric conversion element, numeral 8 the bias wiring of the photoelectric conversion element, numeral 2 the gate wiring of the switching TFT, numeral 4 the gate electrode of the switching TFT, and numeral 9 the source-drain electrode of the switching TFT.

A layer, from which the sensor section of the photoelectric conversion element and the source-drain electrode of the switching TFT are removed, and the lower portion of the signal line are formed in the same layer. Here, reference numeral 5 denotes an insulating film, numeral 6 an amorphous silicon film functioning as an active layer, and numeral 7 an ohmic contact layer. Reference numeral 10 denotes a signal line connected to the switching TFT. Also, reference numeral 100 denotes a protecting film, numeral 101 a bonding layer, and numeral 102 a phosphor layer. There is obtained a construction where incident radiation is made incident from a side on which the phosphor layer exists in the drawing.

Currently, there exists an increasing demand for achieving higher sensitivity of the radiation detecting device of this type to realize the reduction of the amount of radiation. Also, it is hoped to achieve higher definition to realize the higher quality of an image. Under these circumstances, there have been made various developments, such as the improvement of the luminous efficiency of a phosphor, the improvement of the light collection efficiency in a photosensor array, and the improvement of a photoelectric conversion element itself, which is to say a photoelectric conversion efficiency.

In general, in the case where high image quality is achieved, it is first required to obtain a finer pixel pitch. However, if there is obtained such a finer pixel pitch without intricacy, this inversely causes the reduction of sensitivity, which means that it is impossible to realize the finer pixel pitch without complication.

The reason of this is that an effective pixel region is not reduced in accordance with the enhancement of definition but the effective pixel region is required to have the same or a larger area.

That is, it is required to accelerate the driving speed of a switching TFT, a signal processing speed, and the like in accordance with the increase of the number of pixels and it is also required to further reduce the resistances of the driving wiring of the switching TFT, the signal line, and the like. In some cases, it is also required to increase the size of the switching TFT to reduce the on-resistance of the switching TFT or for other purposes.

That is, the ratio of the width of each wiring to the area of a pixel is increased in accordance with the enhancement of definition and the area occupied by the switching TFT does not greatly change, so that the effective aperture ratio of the photoelectric conversion element occupying an area of a pixel generally tends to be reduced in accordance with the reduction of a pixel pitch.

As described above, in the case where higher definition is realized while maintaining a large area, there is reduced the effective aperture ratio of a pixel. As a result, to obtain certain image quality, it is required to increase the amount of radiation, which is not acceptable in a medical field when attentions are paid to the effect on a human body.

FIG. 12 is a plan view illustrating the effective aperture ratio of one pixel. In FIG. 12, reference symbol P represents a pixel pitch, symbol Vg the gate wiring of a switching TFT, symbol Sig a signal line, and symbol S a sensor region of a photoelectric conversion element. When the width of the gate wiring Vg is referred to as Wg, the width of the signal line Sig is referred to as Ws, a clearance between the gate wiring Vg and the sensor region S of the photoelectric conversion element is referred to as Lg, and a clearance with the signal line 10 is referred to as Ls, it is possible to roughly calculate an effective aperture ratio Ap using the following equation.

$$Ap=(P-Wg-2Lg)\times(P-Ws-2Ls)/P^2$$

In reality, however, there exists a switching TFT, so that the actual effective aperture ratio takes a value that is smaller than the effective aperture ratio Ap calculated using this equation. However, to simplify the explanation, the area of the switching TFT is not taken into consideration in this description.

Next, as an example, FIG. 13 shows how an effective aperture ratio changes in accordance with the increase of a pixel pitch under a condition where the width Wg of the gate wiring Vg is set at 10 $\mu$m, the width Ws of the signal line Sig is set at 8 $\mu$m, and the clearances Lg and Ls of the signal line Sig and the gate wiring Vg are each set at 4 $\mu$m.

Here, as to the clearance Lg, it is required that the gate wiring, the gate electrode, and the lower electrode of the photoelectric conversion element are electrically insulated and these construction elements are arranged in the same layer. Therefore, in reality, the clearance Lg exists as a space of about 4 $\mu$m due to the limited performance of a manufacturing apparatus and the like.

Also, as to the clearance Ls, the MIS construction of the photoelectric conversion element and the MIS construction of the lower portion of the signal line are electrically separated from each other. Therefore, in reality, the clearance Ls exists as a space of about 4 $\mu$m, similar to the clearance Lg.

As is apparent from this drawing, it can be confirmed that the effective aperture ratio Ap is sharply reduced in accordance with the reduction of the pixel pitch P, with the sharp reduction starting at a point where the pixel pitch P becomes about 70 or 80 $\mu$m. That is, under present circumstances, it is difficult to realize higher definition of about 70 or 80 $\mu$m because such higher definition causes the great reduction of sensitivity.

On the other hand, in the case of a pixel pitch of about 150 $\mu$m to 200 $\mu$m that has conventionally been used in general cases; even though the effective aperture ratio Ap is improved, it cannot be said that this pixel pitch is satisfactory enough in view of sensitivity at the present stage. That is, as described above, there are imposed limitations concerning the width of each wiring, the size of a switching TFT, and the like, so that it is not expected that higher sensitivity is realized under present circumstances, due to a limitation in improving the effective aperture ratio.

In view of the problems described above, the object of the present invention is to make it possible to improve the effective aperture ratio of a pixel, achieve higher sensitivity, and realize higher definition without causing the degradation of performance of gate wiring, a signal line, and a switching TFT that are indispensable in constructing a pixel.

SUMMARY OF THE INVENTION

In order to attain the above-mentioned object, a photodetecting device according to the present invention has a structure characterized in that: a plurality of pixels including photoelectric conversion elements that convert incident light into electrical signals, are formed on a substrate; and that wiring that is connected to the pixels including the photoelectric conversion elements is arranged on an insulating layer, which has been formed so as to cover the substrate and the photoelectric conversion element, and on a space between at least two adjacent photoelectric conversion elements.

Further, a photodetecting device according to the present invention has a structure characterized in that: a plurality of pixels including photoelectric conversion elements that convert incident light into electrical signals, are formed on a substrate; an organic low permittivity insulating layer is formed so as to cover the substrate and the photoelectric conversion element; and that wiring connected to the pixels including the photoelectric conversion elements is arranged on the organic low permittivity insulating layer.

Further, a photodetecting device according to the present invention has a structure characterized in that: a plurality of pixels including switch elements, which select one of a signal from a photoelectric conversion element and a signal from a semiconductor element, are formed on an insulating substrate; wiring for driving the switch elements is formed along a side of the photoelectric conversion element on the insulating substrate; an insulating layer is formed on the insulting substrate so as to cover at least the driving wiring; the photoelectric conversion element and the switch elements are formed on the insulating layer; and that the driving wiring and a lower electrode of the photoelectric conversion element are separated from each other by an inter-layer insulating layer in a space between adjacent photoelectric conversion elements.

Further, according to the present invention, there is provided a radiation detecting device comprising the above-mentioned photodetecting devices and a wavelength converter for converting radiation into light.

BRIEF DESCRIPTION OF THE DRAWINGS

FIG. 11 shows an X-ray diagnosis system that is an example of a radiation imaging system having the photodetecting device according to the present invention.

FIG. 32 is a schematic plan view showing a sixth embodiment of the present invention.

FIG. 33 is a schematic cross-sectional view taken along the line 33—33 in FIG. 32.

FIG. 34 is a schematic cross-sectional view taken along the line 34—34 in FIG. 32.

DESCRIPTION OF THE PREFERRED EMBODIMENTS

Embodiments of a photodetecting device, a radiation detecting device, and a radiation imaging system, which has the photodetecting device and the radiation detecting device, according to the present invention will be described in detail below with reference to the accompanying drawings.

Figure 1:
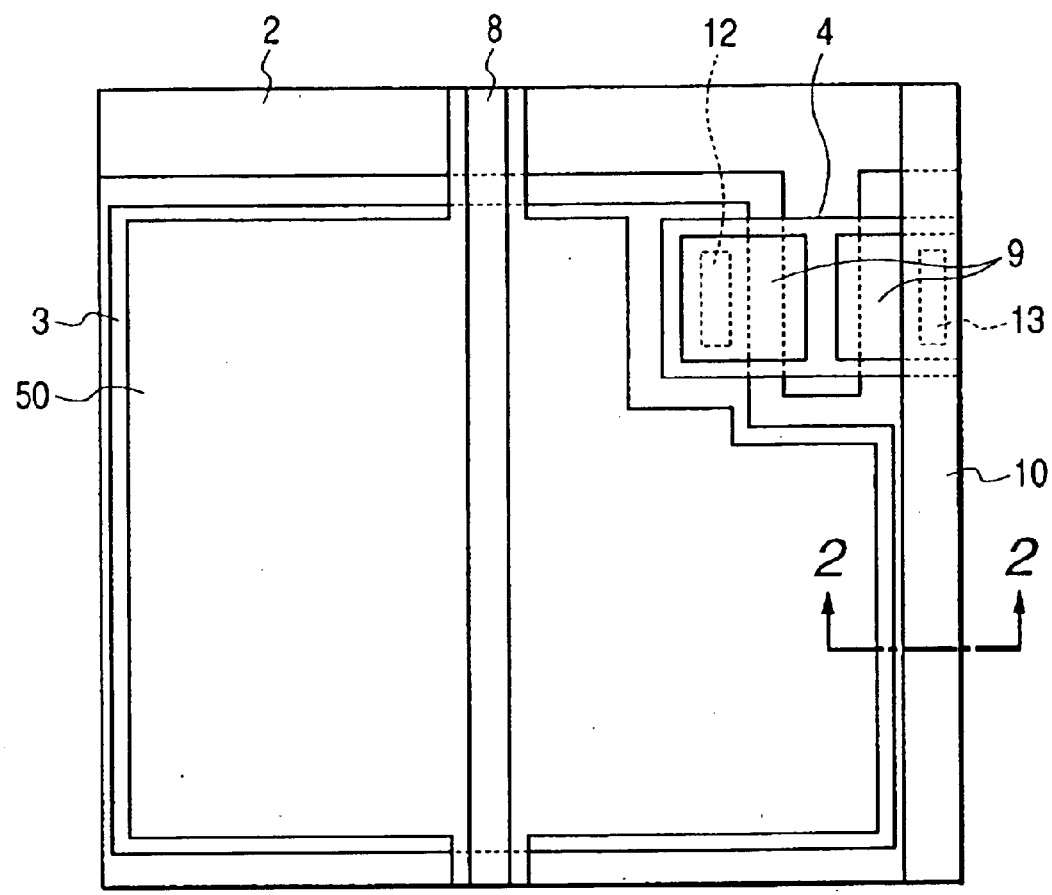
FIG. 1 is a schematic plan view of a first embodiment.
Figure 4:
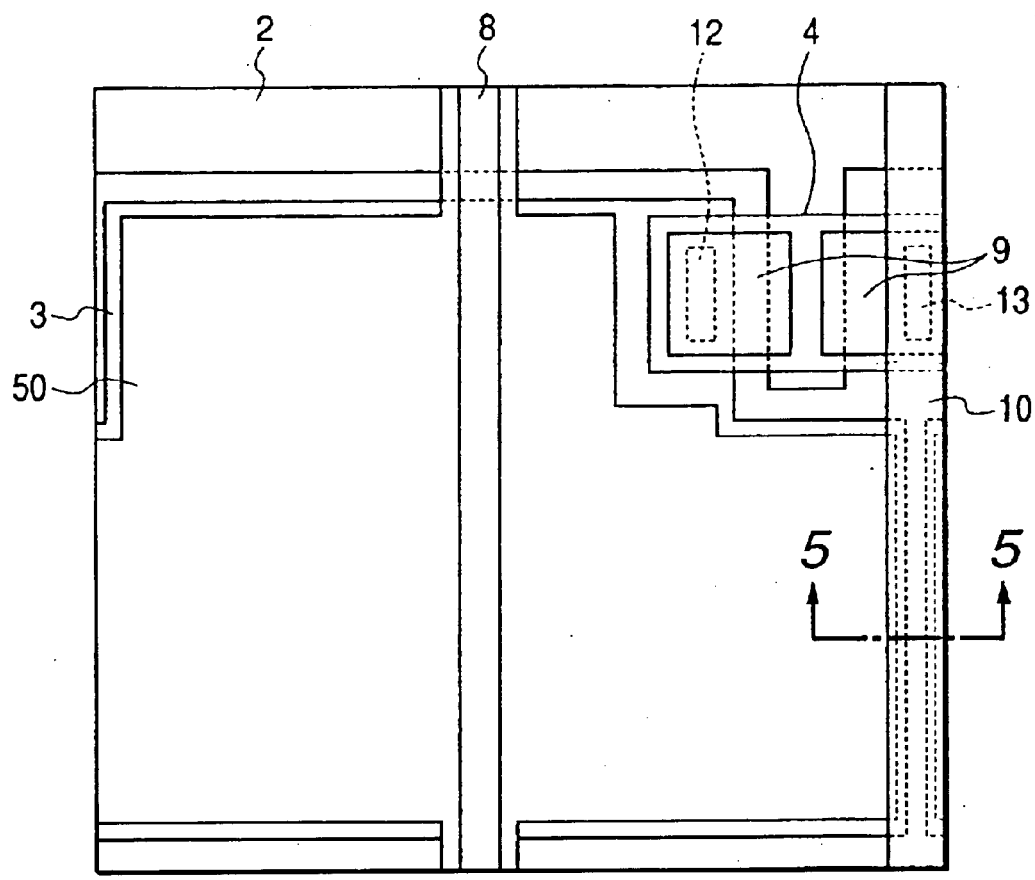
FIG. 4 is a schematic plan view of a second embodiment.

FIGS. 1 and 4 to be referred to in the following description are each a drawing taken from a side on which there is arranged a signal line under a condition where a phosphor is not yet bonded. Each solid line represents a portion that can be viewed from the side on which the signal line is arranged, while each dotted line indicates a portion that cannot be viewed therefrom.

First Embodiment

A first embodiment representing an embodiment of the photodetecting device according to the present invention will be described below. The first embodiment is applied to a photodetecting device that uses an MIS-type photoelectric conversion element. FIG. 1 is a schematic plan view of a pixel constructed of a photoelectric conversion element, a switching TFT, and the like of this embodiment. This plan view is taken from a side on which a signal line is arranged. In FIG. 1, reference numeral 9 denotes a source-drain electrode of the switching TFT, numeral 50 a sensor section of the photoelectric conversion element, numeral 2 gate wiring for driving the switching TFT, numeral 4 a gate electrode of the switching TFT, numeral 10 the signal line, numeral 8 bias wiring of the photoelectric conversion element, numeral 12 a contact hole for electrically connecting the source-drain electrode 9 of the switching TFT to a lower electrode 3 of the photoelectric conversion element, and numeral 13 a contact hole for electrically connecting the source-drain electrode 9 of the switching TFT to the signal line 10 through an insulating layer 11. Also, the insulating layer 11 is formed after the photoelectric conversion element is formed and the bias wiring 8 and the source-drain electrode 9 are further formed. It is possible to easily level a surface by forming the insulating layer with an application method of applying a starting material that will become the insulating layer 11, or with another method. As to this insulating film, it is preferable that there is used an organic low permittivity film whose relative permittivity is equal to or lower than 3.5, more preferably equal to or lower than 3.0.

Figure 2:
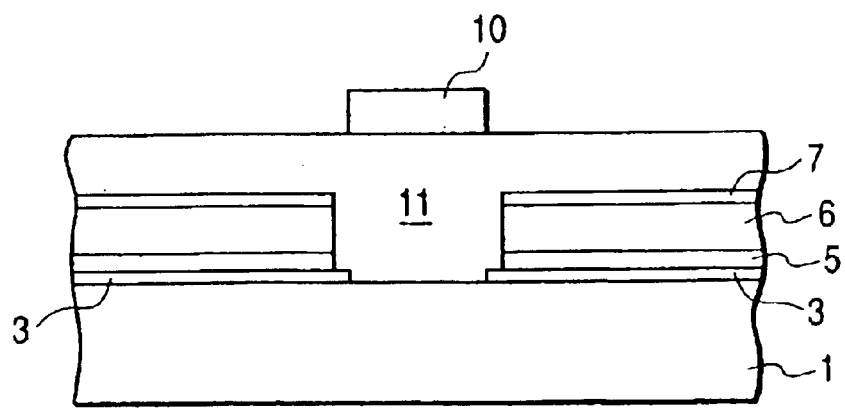
FIG. 2 is a schematic cross-sectional view taken along the line 2—2 in FIG. 1.

Also, FIG. 2 is a schematic cross-sectional view of the section 2—2 in FIG. 1. In FIG. 2, reference numeral 1 denotes a glass substrate, numeral 3 a lower electrode of the photoelectric conversion element, numeral 10 a signal line connected to the source-drain electrode 9 of the switching TFT, numeral 5 an insulating film, numeral 6 an amorphous silicon film functioning as an active layer, numeral 7 an ohmic contact layer that is an n+ layer formed using a non-single crystal silicon doped with an impurity. Reference numeral 11 denotes a leveled insulating layer.

The sensor section 50 of the photoelectric conversion element is constructed of the insulating film 5, the amorphous silicon film 6 functioning as the active layer, and the ohmic contact layer 7 shown in FIG. 2. The photoelectric conversion element and the switching TFT that is not shown in FIG. 2 are constructed in the same layer.

With a conventional technique, the signal line 10 connected to the switching TFT constructing a pixel is arranged on a layer formed in a manufacturing step in which the sensor section 50 and the like are also manufactured. However, in FIG. 2, the signal line 10 of this embodiment is arranged on the insulating layer 11 formed so as to cover the photoelectric conversion element and the substrate. Also, in this embodiment, the signal line 10 is arranged in a space between adjacent photoelectric conversion elements.

Consequently, it becomes possible to shorten the distance between the adjacent photoelectric conversion elements. In this embodiment, considerations are given to the effect of the parasitic capacitance between the signal line and the photoelectric conversion element and there is obtained a construction where the space between the adjacent photoelectric conversion elements becomes the same or substantially the same as the width of the signal line.

Figure 3:
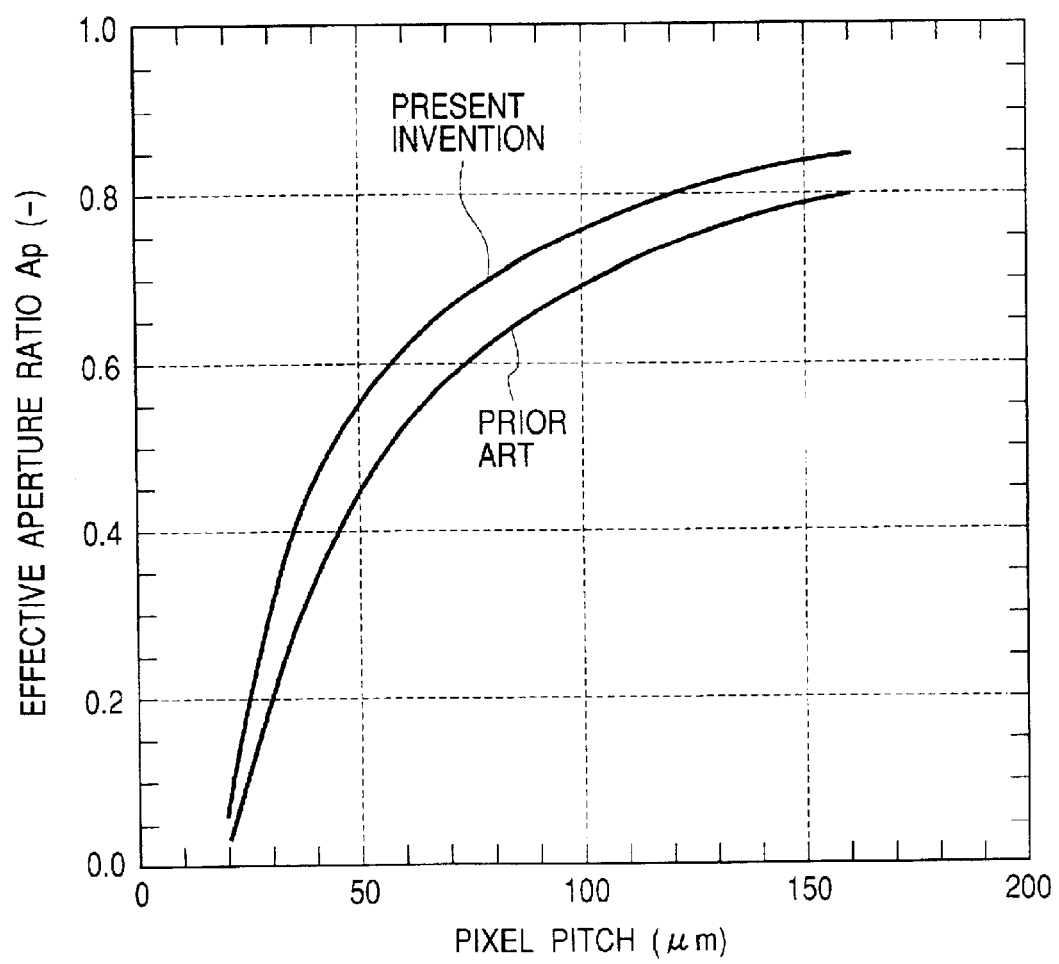
FIG. 3 is a graph showing how an effective aperture ratio changes in accordance with the increase of a pixel pitch of the first embodiment.

As described above, with this construction, it is not required to obtain a clearance between the signal line and the lower electrode of the photoelectric conversion element, which makes it possible to improve the effective aperture ratio Ap. FIG. 3 shows relations between the effective aperture ratio Ap and the clearance Ls between the signal line connected to the switching TFT and the lower electrode of the photoelectric conversion element. In this drawing, a case where Ls is set to 4 μm is shown as a conventional example, while a case where Ls is set to almost 0 μm is shown as this embodiment.

In the conventional example, the source-drain electrode 9 of the switching TFT and the signal line 10 are separately manufactured on different layers that are formed in the same manufacturing step. Therefore, in the case of a construction where elements are separated from each other by one operation with a conventional technique, the minimum clearance Ls is limited to 4 μm because of the limited performance of a manufacturing apparatus. In contrast, in this embodiment, it is possible to perform the production under a condition where the clearance Ls is reduced to almost zero, so that it becomes possible to improve the effective aperture ratio Ap by about 5 to 25%.

Figure 9:
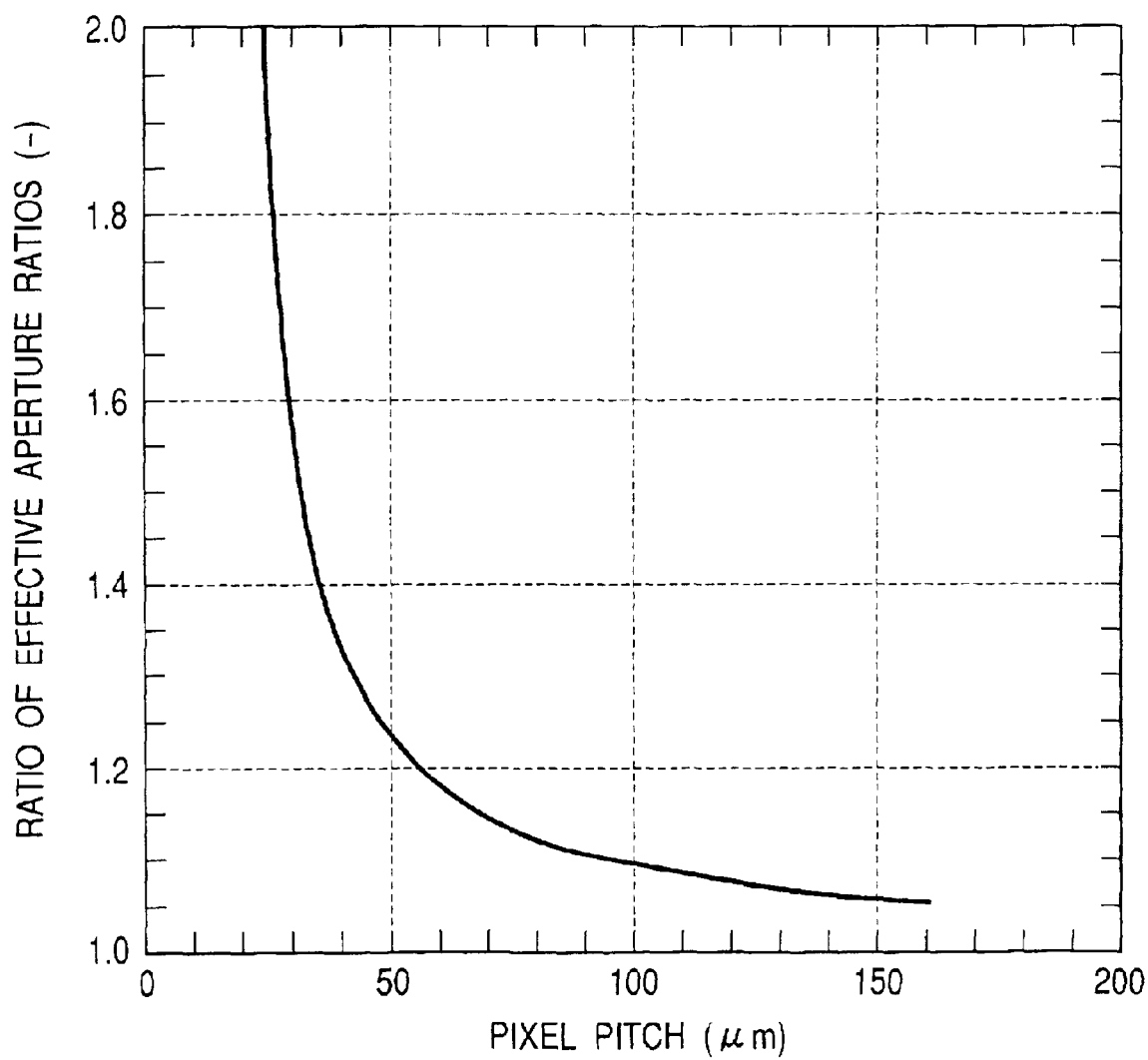
FIG. 9 shows how a ratio of effective aperture ratios changes in accordance with the increase of a pixel pitch, where an effective aperture ratio of the first embodiment is compared with an effective aperture ratio of a conventional example.

In particular, in accordance with the enhancement of definition, that is, in accordance with the reduction of the pixel pitch, the effect of improving the effective aperture ratio Ap is increased. For instance, in the case where the pixel pitch is 100 μm, the effective aperture ratio is increased by 1.1 times in comparison with the conventional example. Also, in the case where the pixel pitch is 50 μm, the effective aperture ratio is increased by 1.25 times in comparison with the conventional example. FIG. 9 shows a ratio of effective aperture ratios where this embodiment is compared with the conventional example. Also, in the case where sensitivity is set so as to become the same as that of the conventional example, that is, in the case where an area occupied by the photoelectric conversion element is set so as to become the same as that of the conventional example, this embodiment makes it possible to reduce the pixel pitch by about 5 μm in comparison with the conventional example.

Next, a manufacturing method of this embodiment will be described. In FIGS. 6A to 8B, each solid line represents an exposed portion and each dotted line represents an unexposed portion.

Figure 6A:
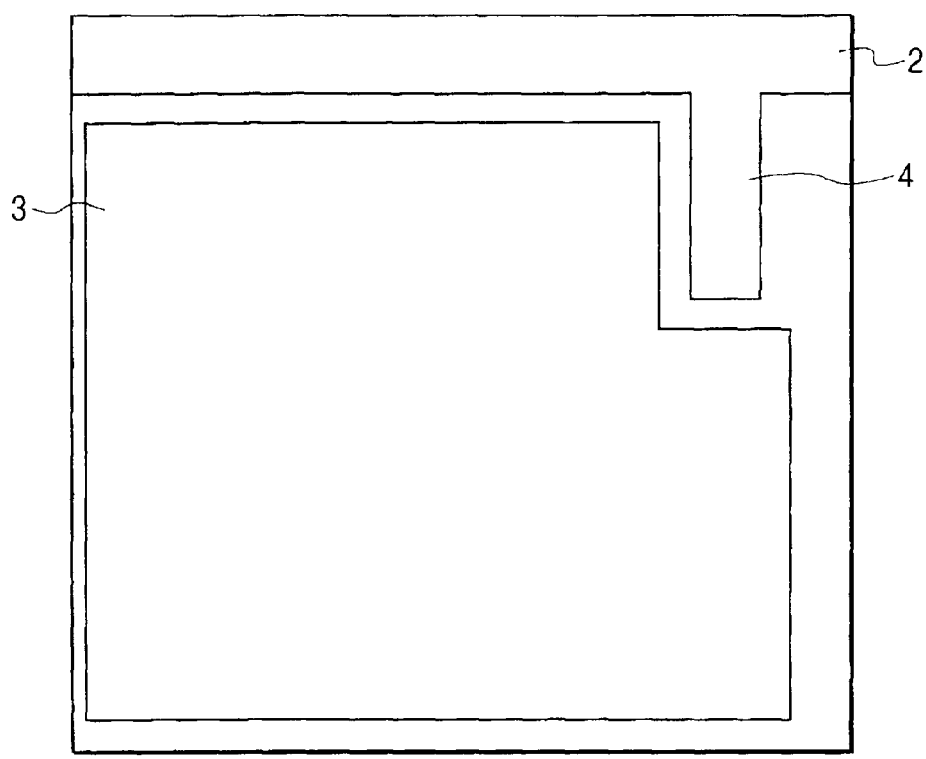
FIGS. 6A and 6B illustrate a manufacturing method of the first embodiment.

(1) As shown in FIG. 6A, as the gate wiring 2 of the switching TFT, the gate electrode 4, and the lower electrode 3 of the photoelectric conversion element, a Cr thin film having a thickness of 1000Å is formed on the glass substrate through sputtering or the like and pattern formation is performed.

Figure 6B:
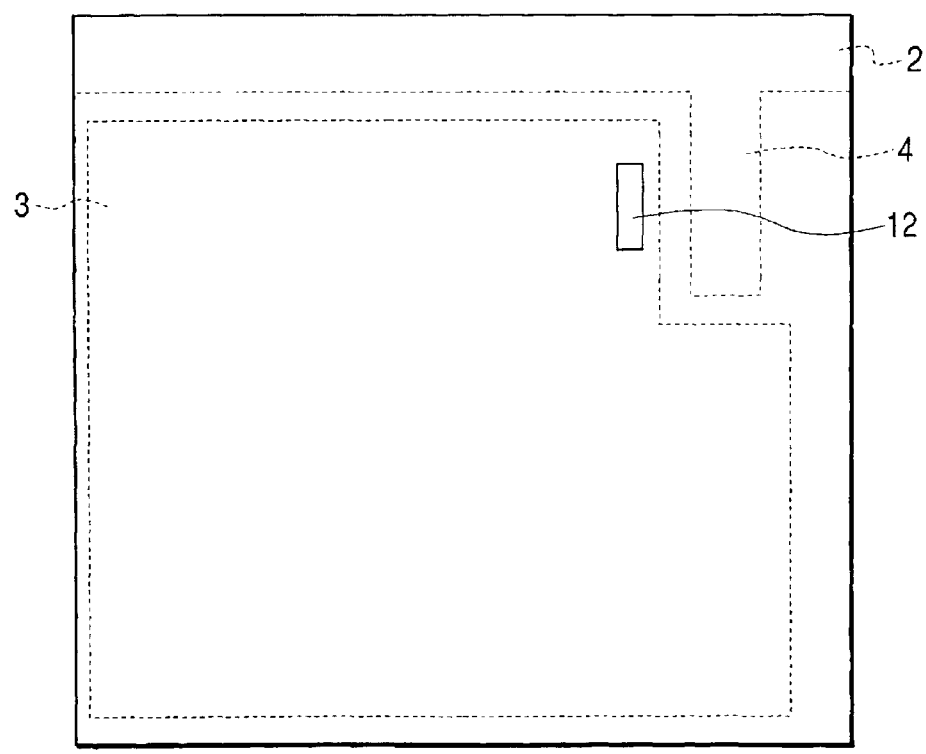

(2) As shown in FIG. 6B, an SiN film having a thickness of 300 nm is formed as the insulating film 5, a nondoped amorphous silicon film having a thickness of 600 nm is formed as the active layer 6, and an n+-type ohmic contact layer having a thickness of 100 nm is formed as the ohmic contact layer 7. These films and layer are formed in succession with a plasma CVD method or the like. Following this, the contact hole 12 for electrically connecting the source-drain electrode 9 of the switching TFT to the lower electrode 3 of the photoelectric conversion element is formed in the insulating film 5, the active layer 6, and the ohmic contact layer 7 with an RIE method or the like.

Figure 7A:
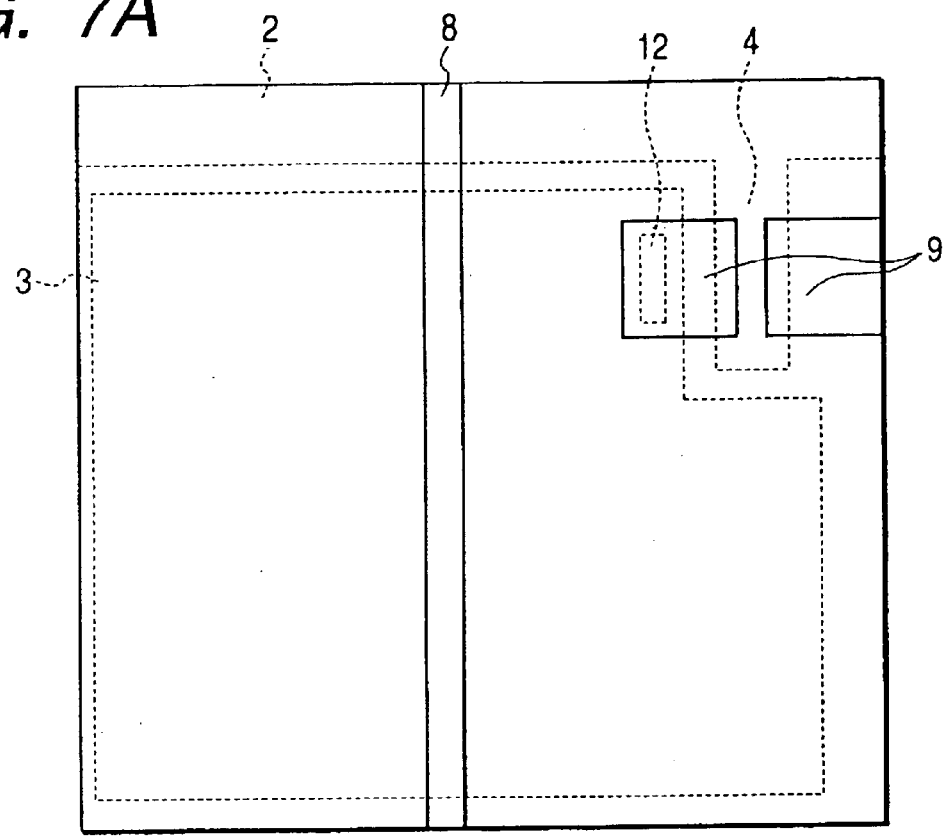
FIGS. 7A and 7B illustrate the manufacturing method of the first embodiment.

(3) As shown in FIG. 7A, an Al thin film, which has a thickness of 1 μm and will become the bias wiring 8 of the photoelectric conversion element and the source-drain electrode 9 of the switching TFT, is formed through sputtering or the like. Then, the film is etched, thereby forming patterns of the bias wiring 8 and the source-drain electrode 9.

Figure 7B:
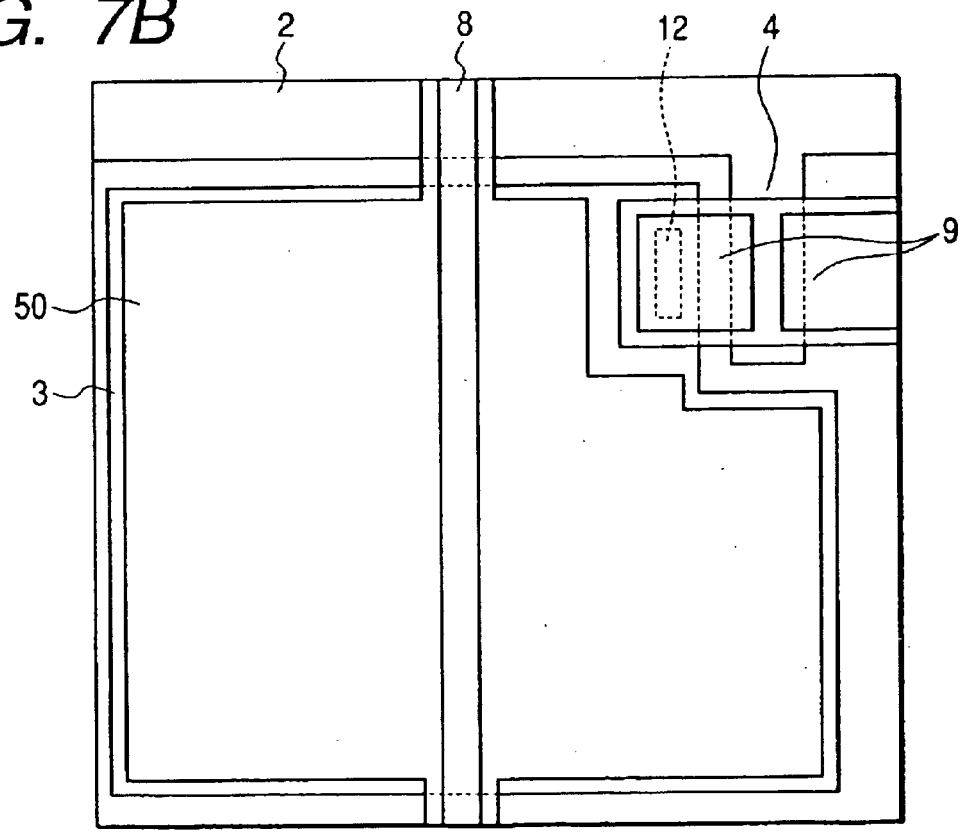

(4) As shown in FIG. 7B, the insulating film 5, the active layer 6, and the ohmic contact layer 7 are partially removed through etching. In this manner, respective pixels are converted into independent construction elements and the sensor section 50 of the photoelectric conversion element and the switching TFT are separated as independent construction elements.

Figure 8A:
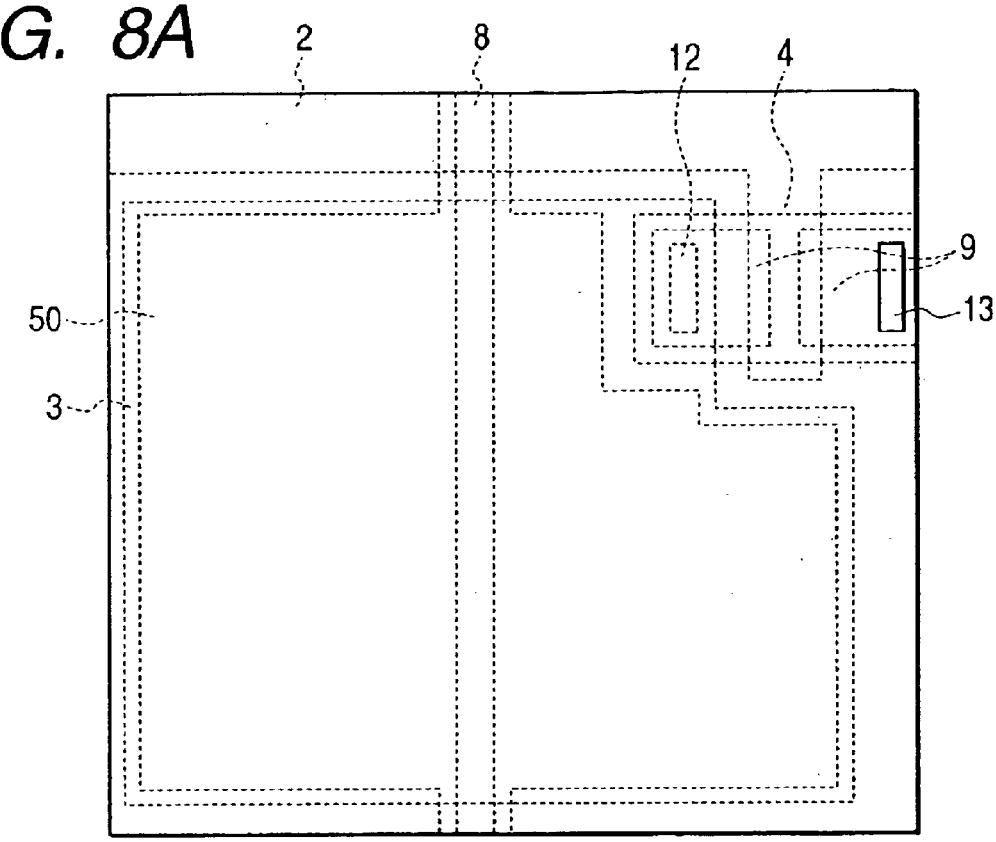
FIGS. 8A and 8B illustrate the manufacturing method of the first embodiment.

(5) As shown in FIG. 8A, as the insulating layer 11, divinylsiloxane bisbenzocyclobutene (BCB manufactured by The Dow Chemical Company) is spin-coated to have a thickness of 2.5 μm, is cured, and is converted into a thin film, thereby forming the insulating layer 11 having a relative permittivity of from 2.6 to 2.7. Following this, a contact hole 13 for establishing an electric connection with the source-drain electrode 4 of the switching TFT is formed in the insulating layer 11 with an RIE method or the like.

Figure 8B:
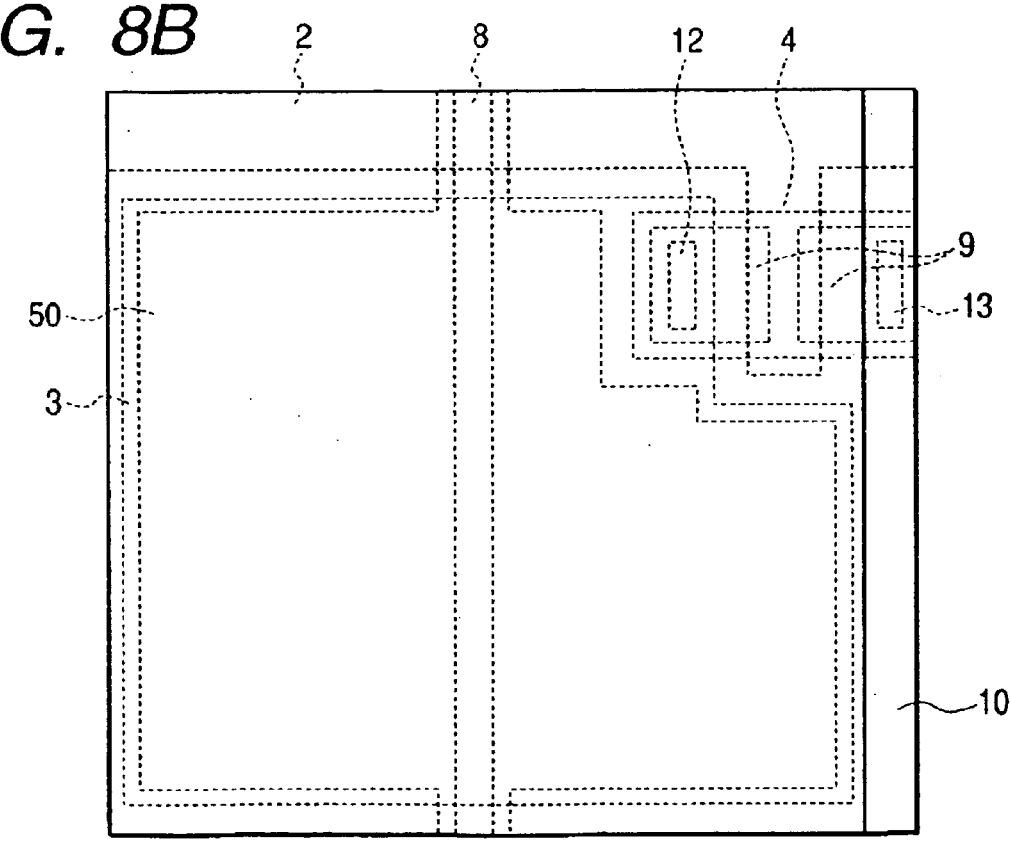

(6) As shown in FIG. 8B, an Al thin film, which has a thickness of 1 μm and will become the signal line 10, is formed through sputtering or the like and is etched, thereby forming a pattern of the signal line 10.

Following this, as necessary, an SiN film and a polyimide film are laminated to form a protecting film.

Further, a scintillator panel, which will become a light converter for converting radiation into visible light and is provided by evaporating a GOS phosphor sheet or CsI, is bonded on the protecting film using an adhesive or the like. In this manner, a radiation detecting device is manufactured.

As described above, with the technique of this embodiment, the clearance between the signal line connected to the switching TFT of the photoelectric conversion element and the lower electrode of the photoelectric conversion element becomes practically unnecessary. As a result, it becomes possible to improve the effective aperture ratio and to achieve higher sensitivity or higher definition.

Also, it becomes possible to suppress the reduction of a resolution resulting from a phenomenon where light obtained by converting radiation passes between the signal line and the photoelectric conversion element and repeats reflection and transmission between the surface and back surface of the substrate.

Second Embodiment

Figure 5:
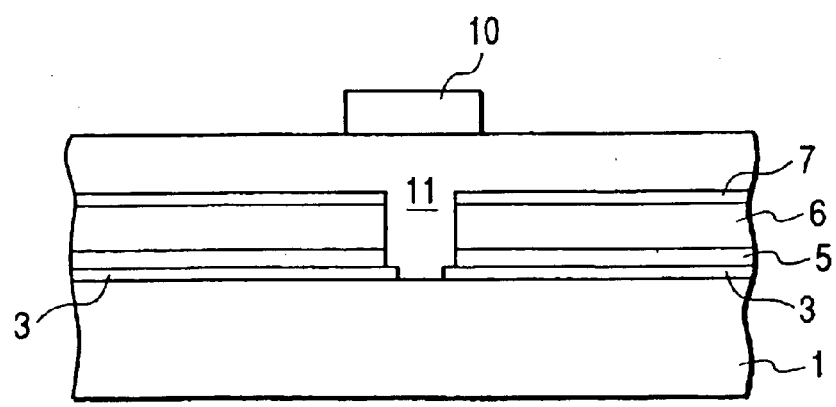
FIG. 5 is a schematic cross-sectional view taken along the line 5—5 in FIG. 4.

A second embodiment representing an embodiment of the photodetecting device according to the present invention will be described below. As in the case with the first embodiment, the second embodiment is applied to a photodetecting device that uses an MIS-type photoelectric conversion element. Similar to FIG. 1, FIG. 4 is a schematic plan view of a pixel constructed of a photoelectric conversion element, a switching TFT, and the like of this embodiment. This plan view is taken from a side on which a signal line is arranged. Also, FIG. 5 is a schematic cross-sectional view of the portion 5—5 in FIG. 4. The same portions as in the first embodiment are given the same reference numerals in this embodiment.

The difference from FIG. 2 resides in that each space between adjacent photoelectric conversion elements is narrower than the width of the signal line. With this construction, there is obtained a construction where the signal line 10, the sensor section 50 and the lower electrode 3 of the photoelectric conversion element overlap one another through the insulating layer 11. As a result, the clearance Ls completely becomes zero and therefore it becomes possible to further improve the effective aperture ratio Ap.

In this case, to reduce the parasitic capacitance between the signal line and the photoelectric conversion element to a level at which the parasitic capacitance exerts no effect, an organic low permittivity insulating layer whose relative permittivity is equal to or lower than 3.5 is used as the insulating layer 11 so as to cover the photoelectric conversion element. Further, the inter-layer insulating layer 11 is formed to have a thickness larger than that in the first embodiment, thereby further reducing the parasitic capacitance. On the other hand, MIS-type semiconductor lamination sections of the adjacent photoelectric conversion elements may be formed as continuous construction elements. However, this construction is not preferable because a step getting-over portion to the lower electrode of each photoelectric conversion element becomes large and there occur problems concerning characteristics such as a minute leak.

Third Embodiment

Figure 17:
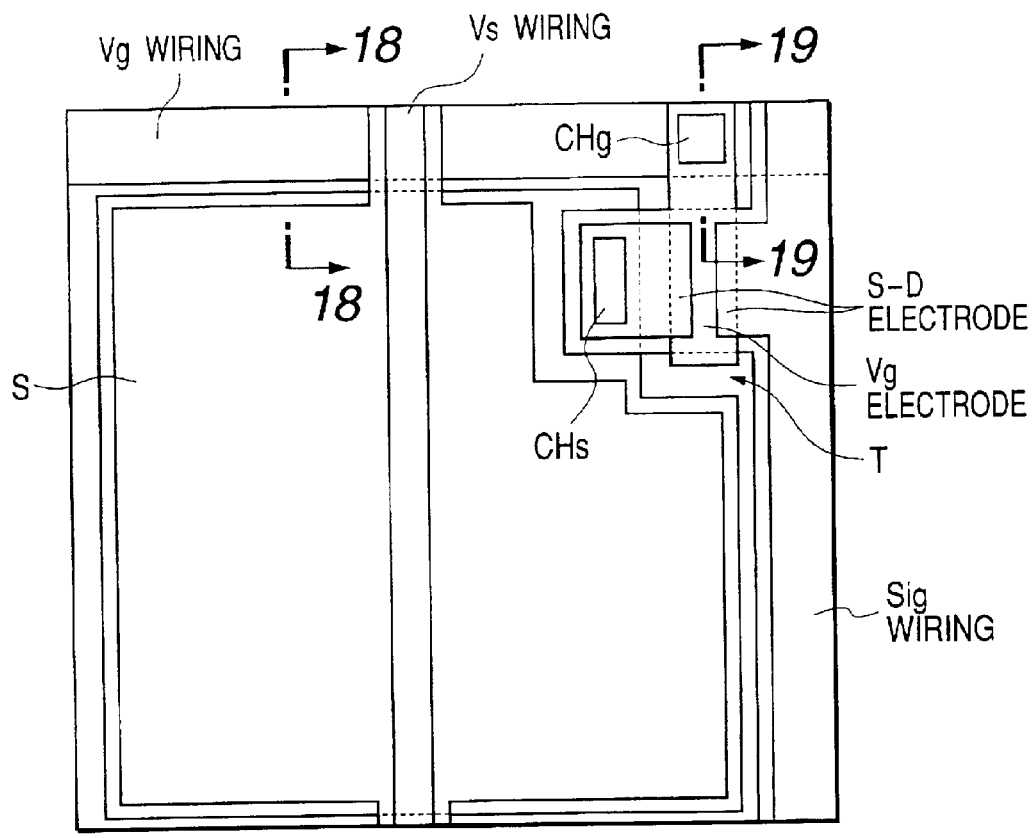
FIG. 17 is a schematic plan view showing a fourth embodiment of the present invention.

As a third embodiment of the present invention, there will be described a photodetecting device that uses an MIS-type photoelectric conversion element. FIG. 17 is a schematic plan view of one pixel of this embodiment. In this drawing, reference symbol T represents a switching TFT (thin film transistor) section, symbol S a sensor (photoelectric conversion element) section, symbol Vg gate wiring, symbol Sig a signal line, symbol Vs bias wiring, symbol CHs a contact hole for electrically connecting an S-D (source-drain) electrode of the switching TFT to the lower electrode of the photoelectric conversion element, symbol CHg a contact hole for electrically connecting the gate wiring of the switching TFT to a gate electrode.

Figure 18:
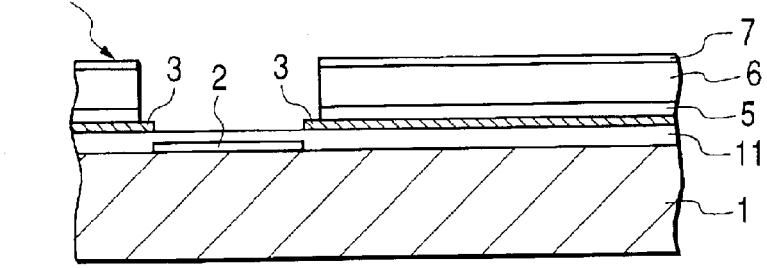
FIG. 18 is a schematic cross-sectional view taken along the line 18—18 in FIG. 17.
Figure 19:
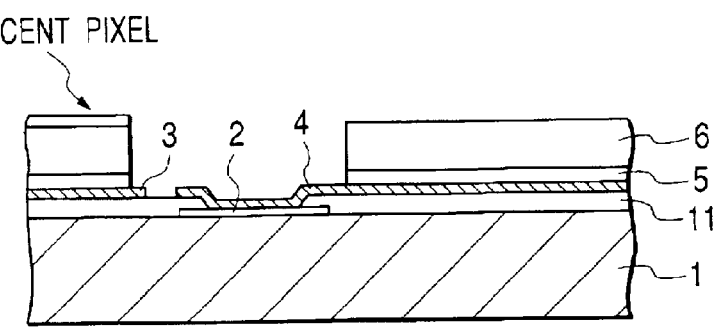
FIG. 19 is a schematic cross-sectional view taken along the line 19—19 in FIG. 17.

FIG. 18 is a schematic cross-sectional view taken along the line 18—18 in FIG. 17, while FIG. 19 is a schematic cross-sectional view taken along the line 19—19 in FIG. 17. In these drawings, reference numeral 1 denotes a glass substrate (insulating substrate), numeral 3 the lower electrode of the MIS-type photoelectric conversion element, numeral 2 gate wiring (Vg wiring) of the switching TFT, numeral 4 a gate electrode (Vg electrode), numerals 5, 6, and 7 a gate insulating film, an amorphous silicon film, and an $n^+$ ohmic contact layer that form the MIS-type photoelectric conversion element and the switching TFT that are constructed in the same layer, and numeral 11 an inter-layer insulating layer having a leveling function. Here, FIG. 17 shows one pixel. In reality, however, a plurality of pixels that are each the same as the pixel shown in FIG. 17 are arranged on the substrate in a two-dimensional manner.

The gate wiring 2 is formed along one side of the pixel and adjacent pixels are arranged so that this gate wiring 2 is sandwiched between the adjacent pixels. In this case, as shown in FIG. 18, the gate electrode 2 of the switching TFT is formed on the glass substrate 1, the inter-layer insulating layer 11 is formed on the entire surface of the glass substrate 1 including the gate wiring 2, and the gate wiring 2 of the switching TFT and the lower electrode 3 of the photoelectric conversion element are separated from each other by the inter-layer insulating layer 11 having the leveling function in a space between pixels that are adjacent to each other.

As described above, in this embodiment, the gate wiring 2 of the switching TFT and the lower electrode 3 of the photoelectric conversion element are formed in different layers. Consequently, it becomes possible to shorten the distance between adjacent photoelectric conversion elements and it becomes unnecessary to prepare a clearance between the gate wiring 2 of the switching TFT and the lower electrode 3 of the photoelectric conversion element. This makes it possible to improve the effective aperture ratio Ap and to realize higher sensitivity.

Also, in this embodiment, the light-receiving area of the photoelectric conversion element has the MIS-type construction and it is possible to obtain a construction where the lower electrode 3 has the next larger size than the MIS-type semiconductor lamination section, as shown in FIG. 18. Therefore, by giving considerations to the effect of the parasitic capacitance between the gate wiring 2 and the photoelectric conversion element, there is obtained a construction where the gate wiring 2 is arranged in an approximately just manner between the lower electrodes 3 of adjacent photoelectric conversion elements. With this construction, the parasitic capacitance between the gate wiring 2 and the photoelectric conversion element is greatly reduced, so that there occurs no problem due to crosstalk and it becomes possible to prevent image degradation. Also, as shown in FIG. 19, the gate wiring 2 of the switching TFT and the gate electrode 4 are separately formed in different layers with the inter-layer insulating layer 11 being sandwiched therebetween. Also, the gate wiring 2 and the gate electrode 4 are electrically connected to each other through the contact hole.

Figure 20:
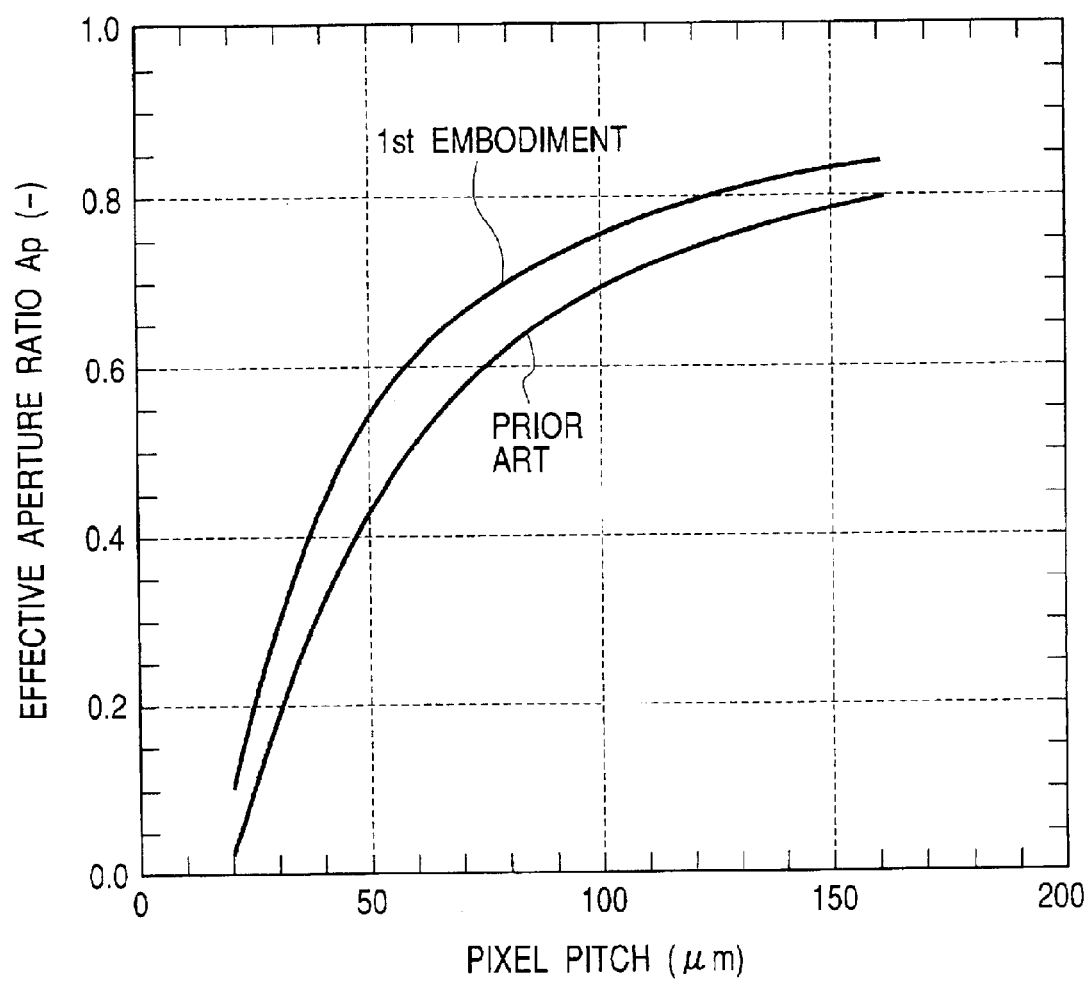
FIG. 20 shows a relation between the pixel pitch and the effective aperture ratio of a pixel in the conventional example and a relation between the pixel pitch and the effective aperture ratio of a pixel in the embodiment shown in FIG. 17.

FIG. 20 shows relations between the effective aperture ratio Ap and the clearance Lg between the gate wiring 2 of the switching TFT and the lower electrode 3 of the photoelectric conversion element. In this drawing, a case where Lg is set to 4 μm is shown as a conventional example, while a case where Lg is set to almost 0 μm is shown as in the first embodiment. In the case of a structure in which various construction elements are formed by one operation with the conventional technique, the minimum clearance Lg is limited to 4 μm because of the limited performance of a manufacturing apparatus. On the other hand, in the first embodiment, it is possible to form the construction elements under a condition where the clearance Lg is reduced to almost zero. As a result, it becomes possible to improve the effective aperture ratio Ap by about 5 to 25%.

Figure 21:
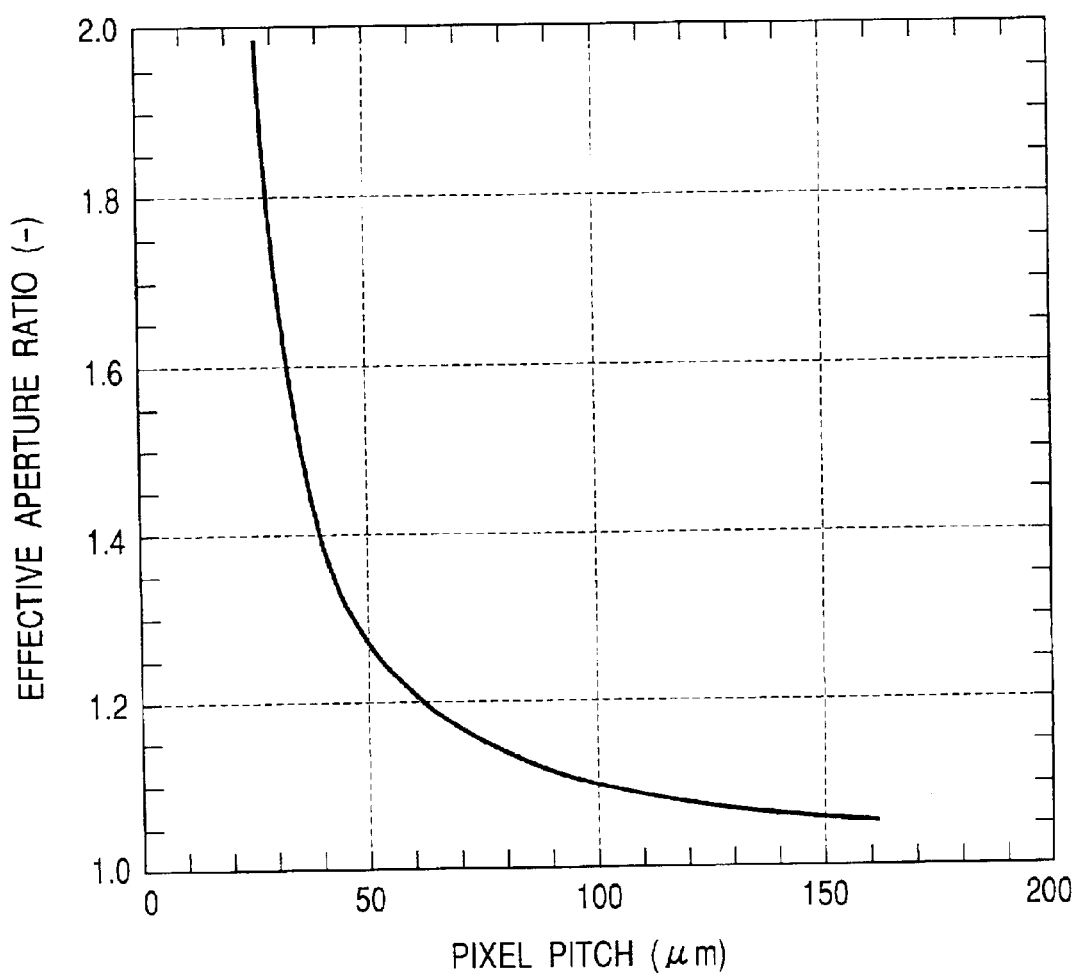
FIG. 21 shows how a ratio of effective aperture ratios changes in accordance with the increase of the pixel pitch in the embodiment shown in FIG. 17 and the conventional example.

In particular, it is possible to increase the effect of improving the effective aperture ratio Ap in accordance with the enhancement of definition, that is, in accordance with the reduction of the pixel pitch. For instance, in the case where the pixel pitch is 100 μm, the effective aperture ratio is increased by 1.1 times in comparison with the conventional example. Also, in the case where the pixel pitch is 50 μm, the effective aperture ratio is increased by 1.25 times in comparison with the conventional example. FIG. 21 shows a ratio of effective aperture ratios in the case where the same pixel pitch is used in both of this embodiment and the conventional example, that is, shows the effective aperture ratio of this embodiment in comparison with a conventional effective aperture ratio normalized as 1. And, in the case that sensitivity is set so as to be the same as that of the conventional example, that is, in the case that an area (P×P×Ap) occupied by the photoelectric conversion element is set so as to be the same as that of the conventional example, it becomes possible to reduce the pixel pitch by about 5 μm with the technique of this embodiment, in comparison with the conventional example. Also, it becomes possible to realize higher definition.

Next, a method of manufacturing the semiconductor device of this embodiment will be described with reference to FIGS. 22 to 27.

Figure 22:
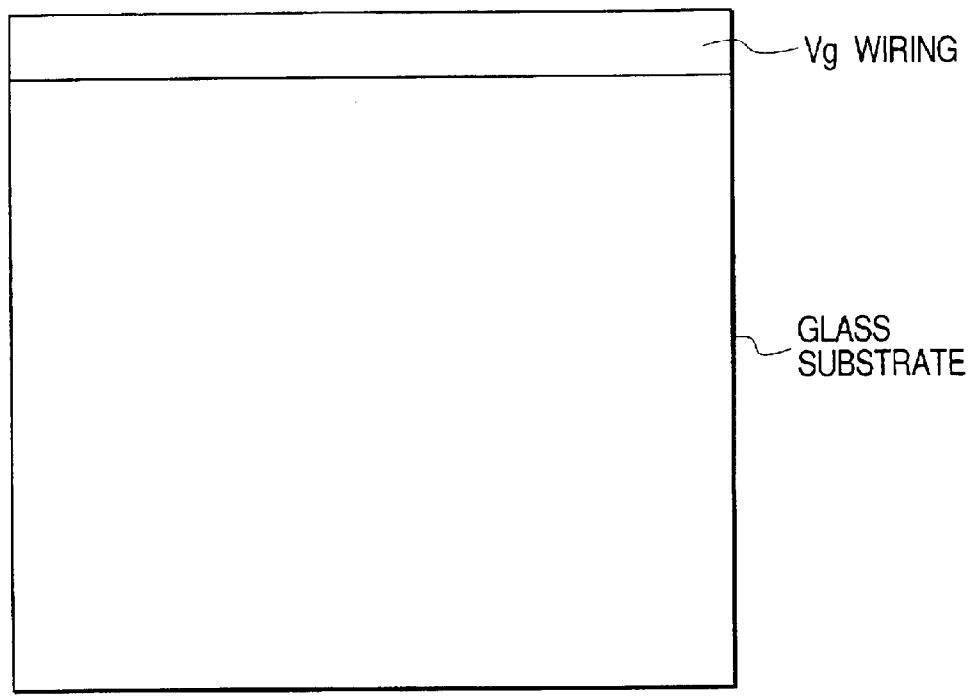
FIG. 22 illustrates a method of manufacturing a semiconductor device shown in FIG. 17.

(1) As shown in FIG. 22, as the gate wiring of the switching TFT, a Cr thin film having a thickness of 3000 Å is formed on the glass substrate through sputtering, thereby patterning of the wiring Vg.

Figure 23:
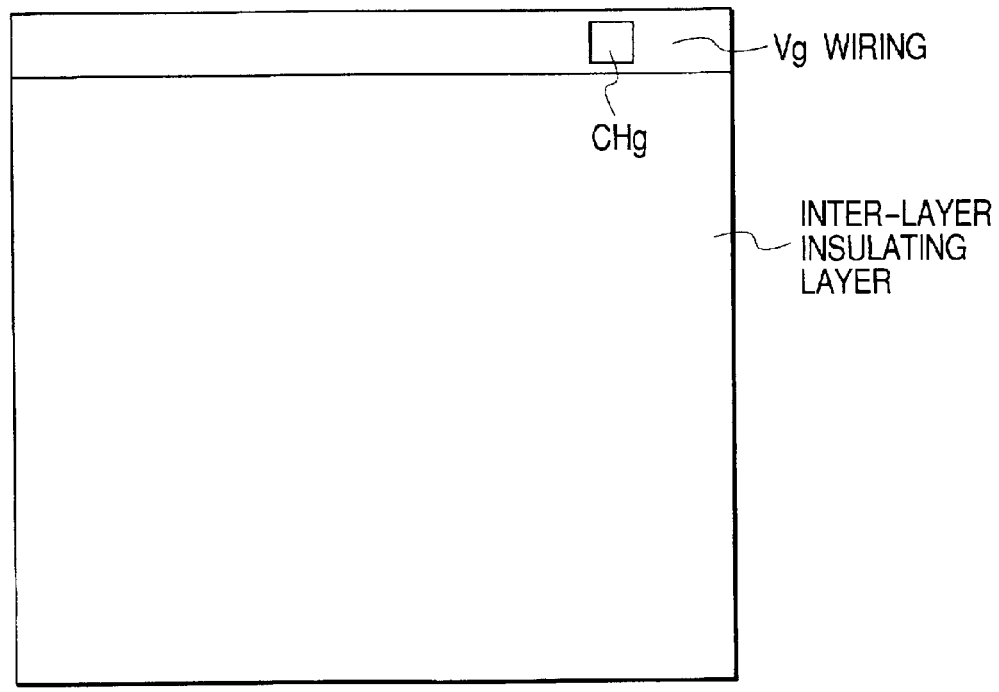
FIG. 23 illustrates the method of manufacturing the semiconductor device shown in FIG. 17.

(2) As shown in FIG. 23, as the inter-layer insulating layer 11, BCB (manufactured by The Dow Chemical Company) is spin-coated to have a thickness of 5000 Å, is cured, and is converted into a thin film. Further, the contact hole CHg for establishing an electric connection with the Vg electrode of the switching TFT is formed through RIE.

Figure 24:
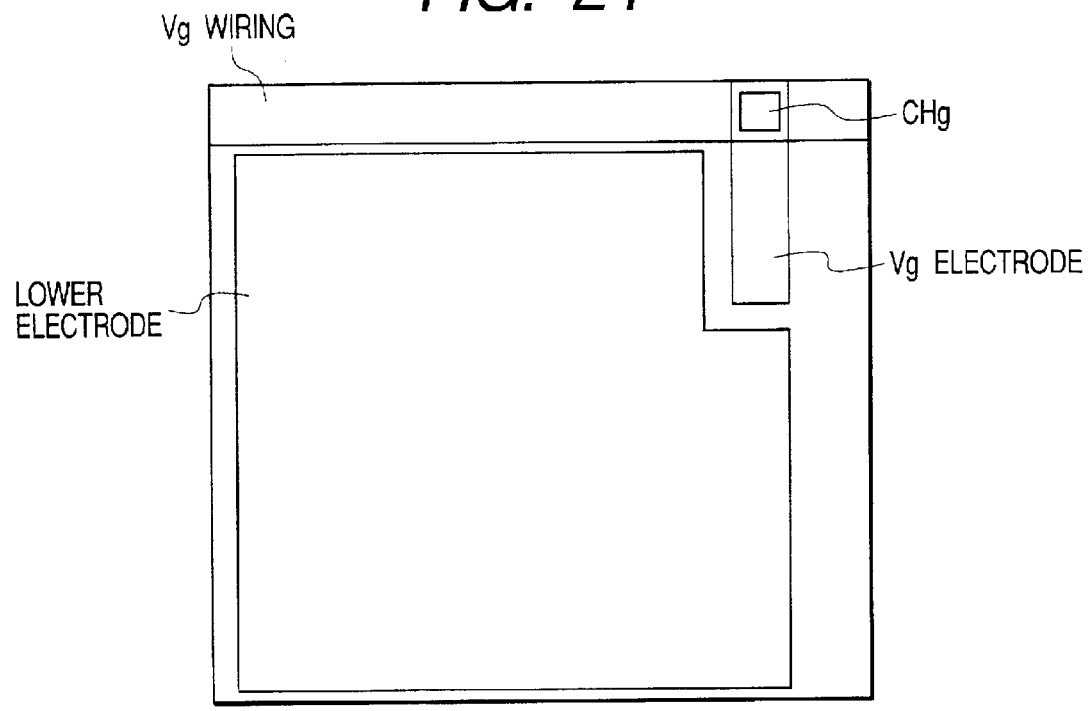
FIG. 24 illustrates the method of manufacturing the semiconductor device shown in FIG. 17.

(3) As shown in FIG. 24, a Cr thin film having a thickness of 1000 Å is formed through sputtering as the Vg electrode 4 of the switching TFT and the lower electrode of the photoelectric conversion element, thereby patterning the Vg electrode 4 and the lower electrode of the photoelectric conversion element.

Figure 25:
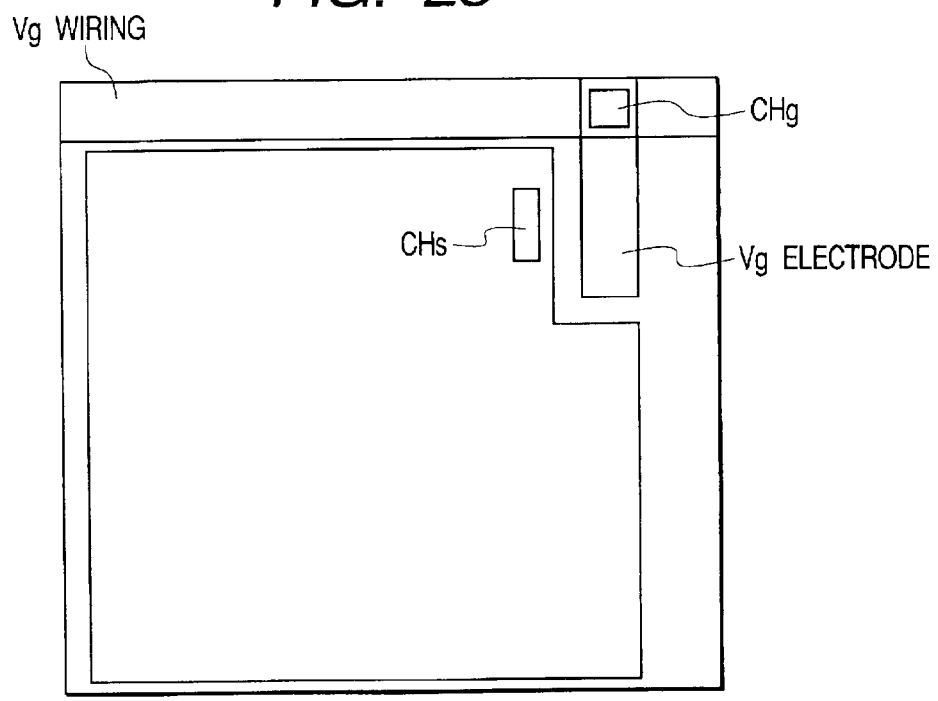
FIG. 25 illustrates the method of manufacturing the semiconductor device shown in FIG. 17.
Figure 28:
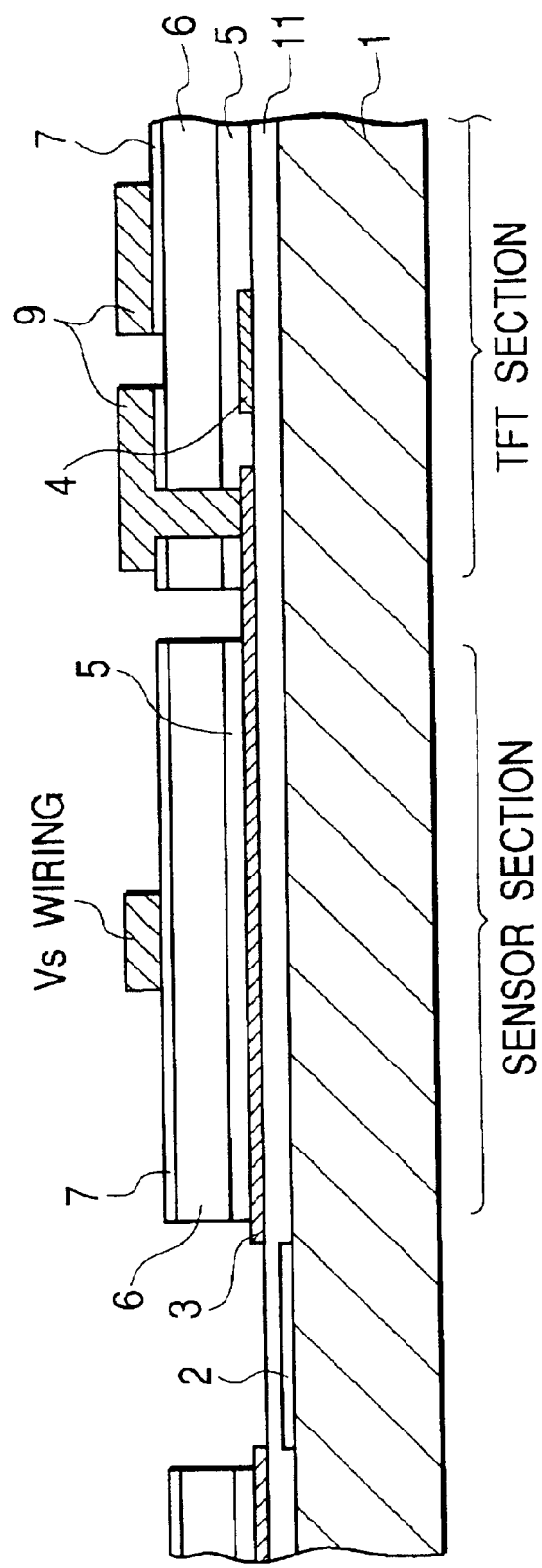
FIG. 28 is a schematic cross-sectional view taken along the line 28—28 in FIG. 27.

(4) As shown in FIG. 25, an SiN film having a thickness of 3000 Å is formed as a gate insulating film, a nondoped amorphous silicon film having a thickness of 6000 Å is formed as an active layer, and an n$^+$ ohmic contact layer having a thickness of 1000 Å is formed, these films and layer being formed in succession through plasma CVD (see FIG. 28). Following this, the contact hole CHs for electrically connecting the S-D electrode of the switching TFT to the lower electrode of the photoelectric conversion element is formed through RIE.

Figure 26:
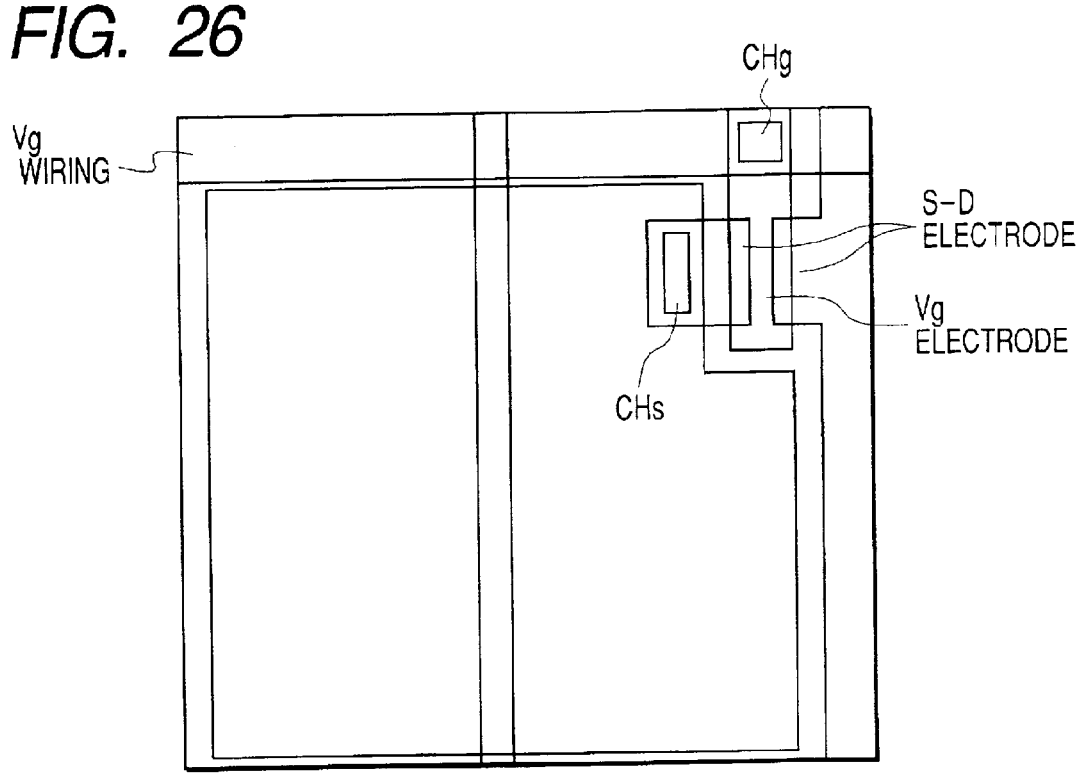
FIG. 26 illustrates the method of manufacturing the semiconductor device shown in FIG. 17.

(5) As shown in FIG. 26, an Al thin film having a thickness of 1 μm is formed through sputtering to be the bias wiring, and Vs wiring of the photoelectric conversion element, the S-D electrode of the switching TFT, the signal line, and Sig wiring. Then, a pattern of each of these construction elements is formed.

Figure 27:
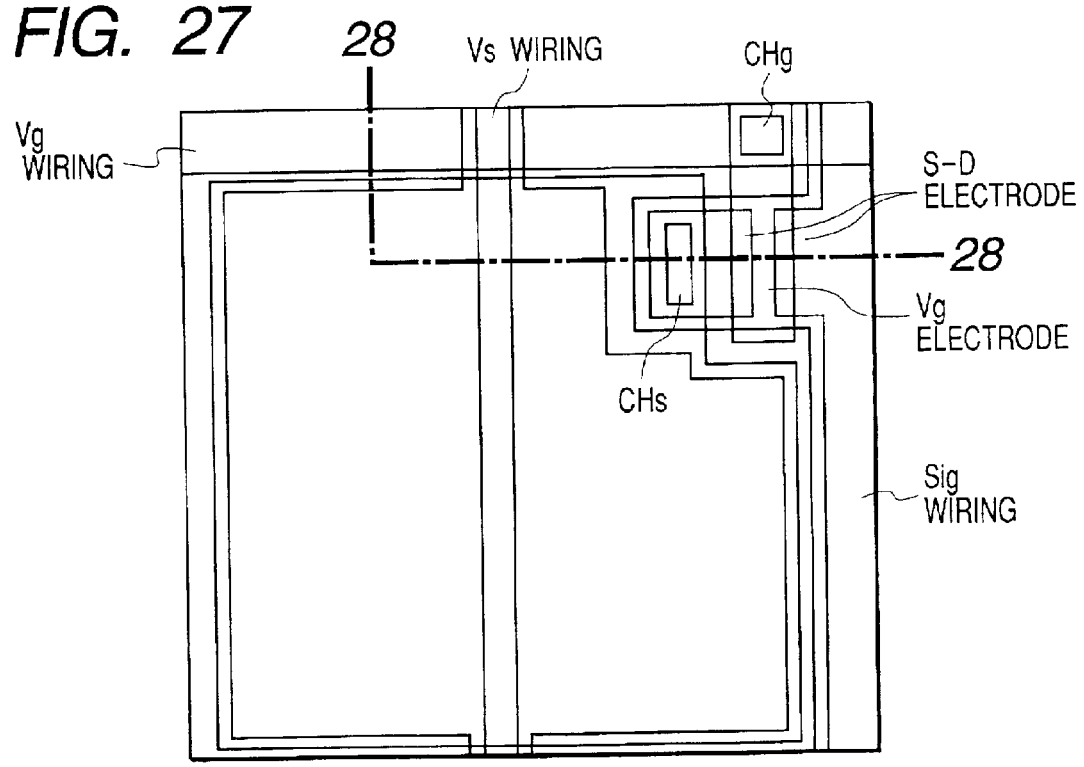
FIG. 27 illustrates the method of manufacturing the semiconductor device shown in FIG. 17.

(6) As shown in FIG. 27, the switching TFT sections, the photoelectric conversion element sections, and the like corresponding to respective pixels are separated from each other.

Following this, the photodetecting device is finished by laminating an SiN film and a polyimide film to form a protecting film. Further, a scintillator panel provided by evaporating a GOS phosphor sheet or CsI is bonded on the protecting film using an adhesive, thereby finishing the radiation detecting device. It is possible to use x-rays, α-rays, β-rays, γ-rays, or the like as radiation. Incident radiation is converted into visible light by the phosphor sheet and the visible light is converted into electronic signal by photoelectric conversion elements that are arranged in a two-dimensional manner, thereby performing radiography.

Also, even in the case where an MIS-type sensor is simply used as a capacitance and is combined with GaAs or the like that directly converts radiation into electric charges, there is obtained an advantage that it becomes possible to maintain a large MIS capacitance. That is, in the case where a construction element having sensitivity to radiation is used as a semiconductor layer for performing detection, there is no particular need to provide a phosphor layer. That is, it is possible to directly convert radiation into electric charges, so that there is no need to provide a wavelength converter such as a phosphor layer.

FIG. 28 is a schematic cross-sectional view taken along the line 28—28 in FIG. 27. FIG. 28 shows a sensor section and a TFT section. In this drawing, reference numeral 1 denotes a glass substrate, numeral 3 the lower electrode of the photoelectric conversion element, and reference symbol Vs represents the bias wiring of the photoelectric conversion element. Also, numeral 2 denotes gate wiring of the switching TFT, numeral 4 a gate electrode, and numeral 9 a source-drain electrode. Numerals 5, 6, and 7 indicate a gate insulating film, an amorphous silicon film, and an n$^+$ ohmic contact layer that form the photoelectric conversion element, the switching TFT, and the like that are formed in the same layer. Numeral 11 denotes an inter-layer insulating layer. As described with reference to FIG. 25, the gate insulating film 5, the amorphous silicon film 6, and the n$^+$ ohmic contact layer 7 are formed on a Cr thin film in succession. By forming an insulating film on the entire surface of a substrate as in this embodiment, it becomes possible to level the entire surface of the substrate without difficulty.

As described above, with the technique of this embodiment, the driving wiring of the switch element and the lower electrode of the semiconductor element are separated from each other in a space between adjacent pixels by the inter-layer insulating layer having the leveling function, so that the clearance between the semiconductor element and the driving wiring of the switch element becomes practically unnecessary. As a result, it becomes possible to improve the effective aperture ratio of a pixel and to achieve higher sensitivity and higher definition. Also, there is obtained a structure where the driving wiring of the switch element and the lower electrode of the semiconductor element are arranged so as to overlap each other between pixels and there exists no space between the pixels. As a result, it becomes possible to suppress the reduction of a resolution resulting from a phenomenon where light obtained by converting radiation pass through a space between the driving wiring and the semiconductor element and repeats reflection and transmission between the surface and back surface of the substrate.

Fourth Embodiment

Figure 29:
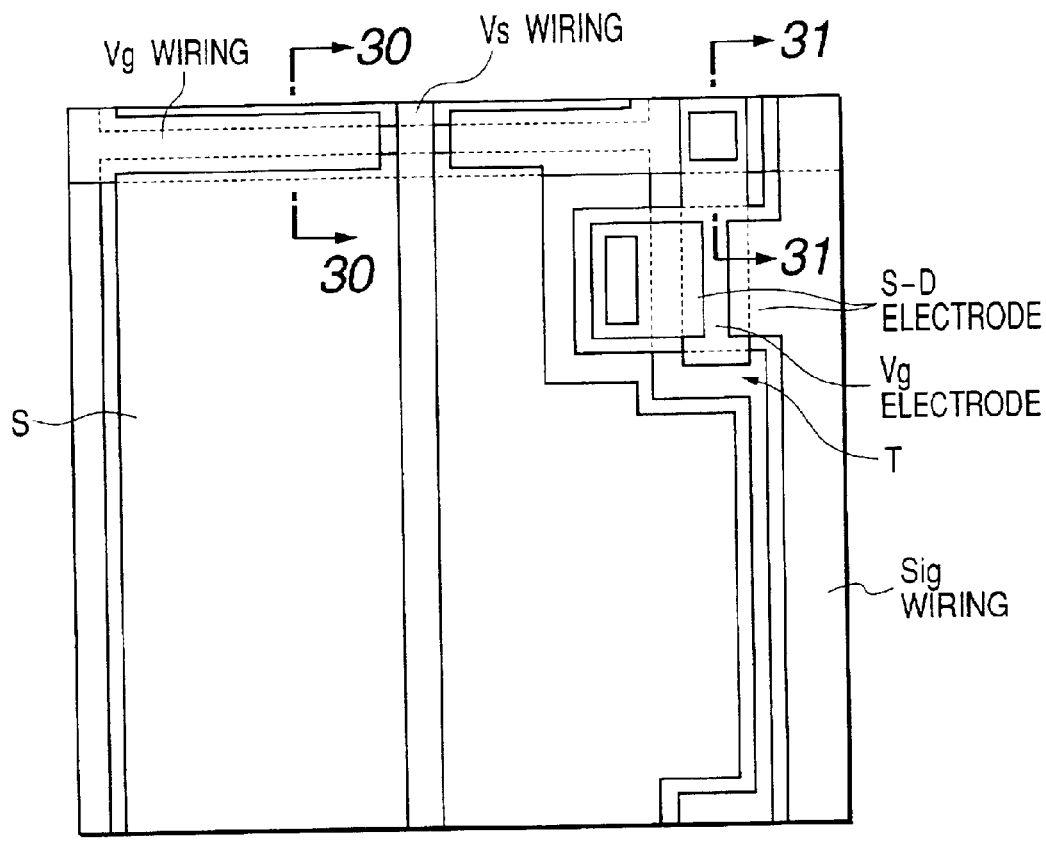
FIG. 29 is a schematic plan view showing a fifth embodiment of the present invention.
Figure 30:
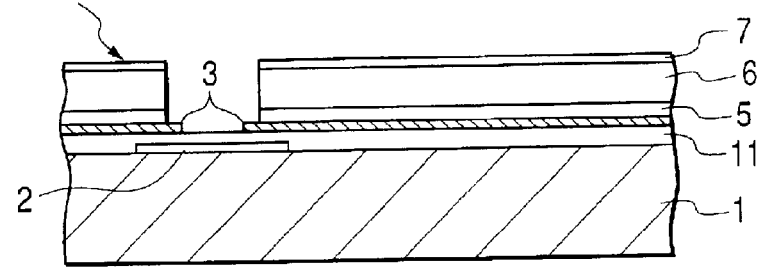
FIG. 30 is a schematic cross-sectional view taken along the line 30—30 in FIG. 29.
Figure 31:
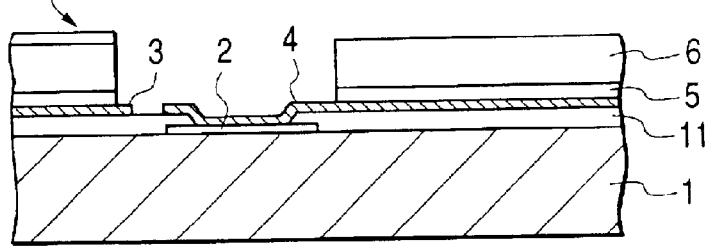
FIG. 31 is a schematic cross-sectional view taken along the line 31—31 in FIG. 29.

Next, the fourth embodiment of the present invention will be described. In the second embodiment, there is used an MIS-type photoelectric conversion element as in the first embodiment. FIG. 29 is a schematic plan view of one pixel of this embodiment. Also, FIG. 30 is a schematic cross-sectional view taken along the line 30—30 in FIG. 29, while FIG. 31 is a schematic cross-sectional view taken along the line 31—31. In FIGS. 29 to 31, the same portions as in the first embodiment are given the same reference symbols.

In this embodiment, as is apparent from FIG. 31, spaces between adjacent pixels are further narrowed in comparison with the third embodiment, and the gate wiring 2 of the switching TFT and the lower electrode 3 of the photoelectric conversion element are formed so as to overlap each other with the inter-layer insulating film 11 being sandwiched therebetween. In this case, the line width of the gate wiring 2 is the same as that in the first embodiment. Therefore, by forming the gate wiring 2 and the lower electrode 3 of the photoelectric conversion element so as to overlap each other, it becomes possible to further improve the effective aperture ratio Ap. That is, it becomes possible to improve the effective aperture ratio Ap by about 10 to 50% in comparison with the conventional example. Other constructions are the same as those in the third embodiment.

It should be noted here that to reduce the parasitic capacitance between the gate wiring 2 and the lower electrode 3 to a level at which the parasitic capacitance exerts no effect, it is preferable that the inter-layer insulating layer 11 is formed as a thick film, thereby reducing the parasitic capacitance. It is preferable that the thickness is at least equal to an overlapping width. That is, if the overlapping width is 1 μm, it is preferable that the inter-layer insulating layer 11 has a thickness of 1 μm or more. Also, if the overlapping width is 2 μm, it is preferable that the inter-layer insulating layer 11 has a thickness of 2 μm or more.

Also, MIS-type semiconductor lamination sections of adjacent photoelectric conversion element sections may be formed as continuous construction elements. However, in this case, it is required to pay attentions to problems concerning characteristics, such as a minute leak, because a step getting-over portion to the lower electrode of each photoelectric conversion element becomes large. Also, it is possible to construct a radiation detecting device by further forming a protecting film and bonding a phosphor sheet on the protecting film with an adhesive, as in the first embodiment.

Fifth Embodiment

Next, the fifth embodiment of the present invention will be described. There is a case where a stress of the inter-layer insulating film becomes a problem in accordance with the increase of an area. This embodiment is characterized by a structure that in particular reduces such stress. FIG. 32 is a schematic plan view of one pixel of this embodiment, FIG. 33 is a schematic cross-sectional view taken along the line 33—33 in FIG. 32, and FIG. 34 is a schematic cross-sectional view taken along the line 34—34 in FIG. 32. The same portions as in the first embodiment are given the same reference numerals. In this embodiment, the inter-layer insulating layer 11 is formed on the glass substrate 1 so as to cover the gate wiring 2 of the switching TFT in a stripe manner, thereby reducing the covering ratio expressing a degree of the glass substrate 1 being covered with the inter-layer insulating layer 11. Constructions other than the construction of the inter-layer insulating layer 11 are the same as those in the first embodiment.

With the technique of this embodiment, it becomes possible to greatly reduce the covering ratio expressing a degree of the glass substrate being covered with the inter-layer insulating layer 11. As a result, it becomes possible to prevent the degradation of characteristics of a sensor array or the like caused by the warpage of the photosensor array due to the stress of the inter-layer insulating layer 11 and to solve various problems such as a crack of the sensor array that occurs due to the stress when stage suction is performed during manufacturing. Also, it is possible to construct a radiation detecting device by further forming a protecting film and bonding a phosphor sheet on the protecting film with an adhesive, as in the first embodiment.

Sixth Embodiment

Next, there will be described an implementation example of a radiation detecting device that is obtained by bonding a phosphor to the photodetecting device according to the present invention and detects radiation such as X-rays. A radiation imaging system having the radiation detecting device will also be described. As one example of the radiation imaging system, there is applied an X-ray diagnosis system.

Figure 10A:
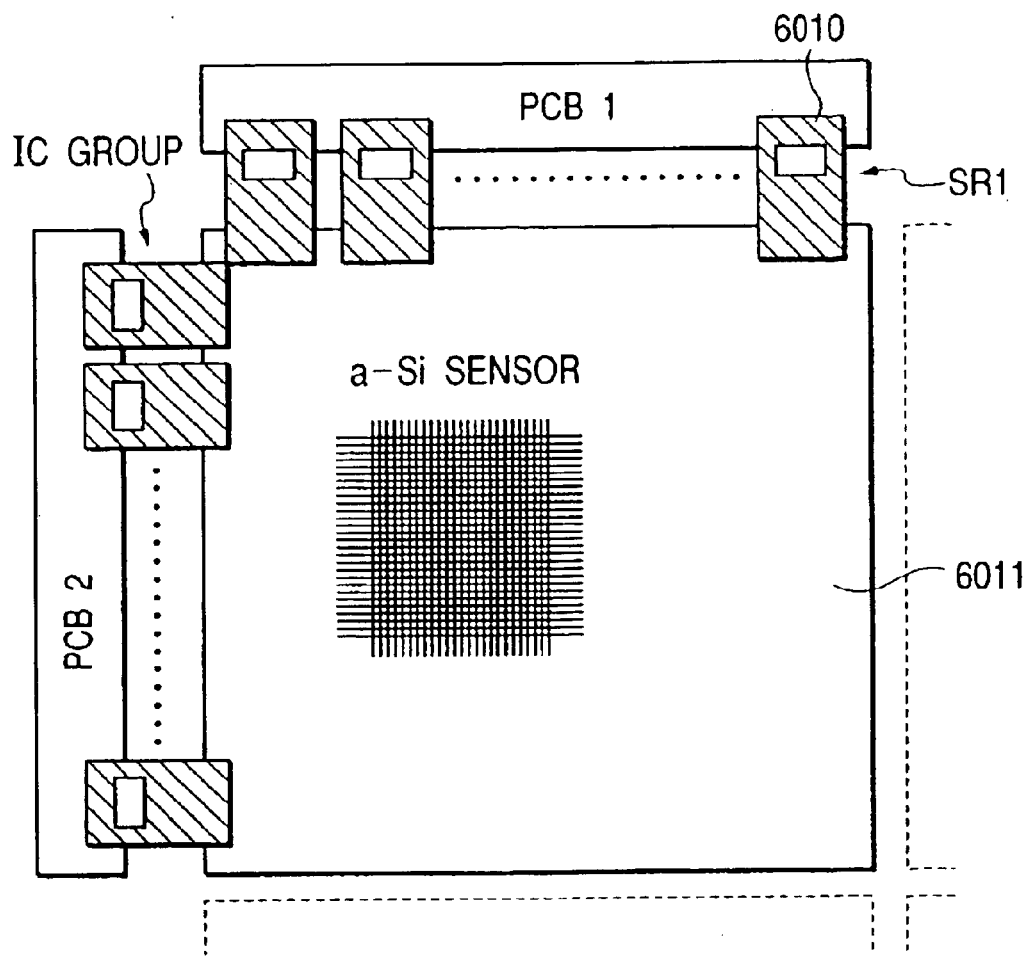
FIGS. 10A and 10B are respectively a schematic construction diagram and a schematic cross-sectional view of an implementation example of a photodetecting device according to the present invention.
Figure 10B:
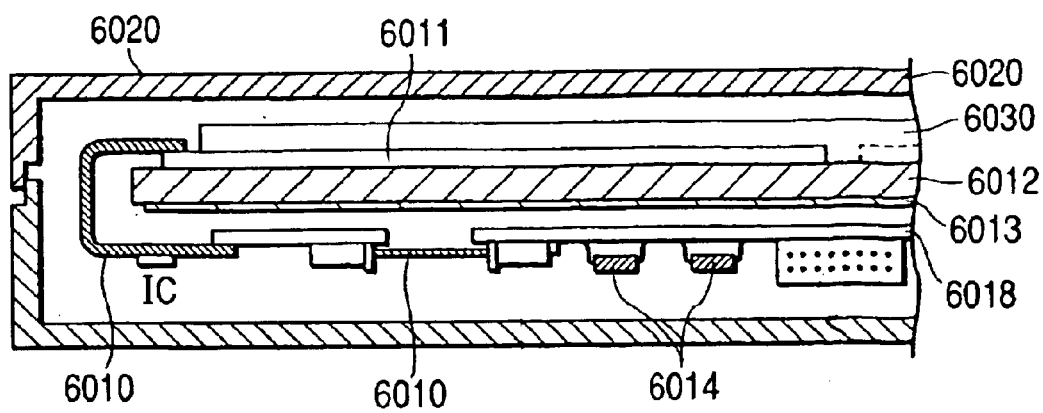
Figure 12:
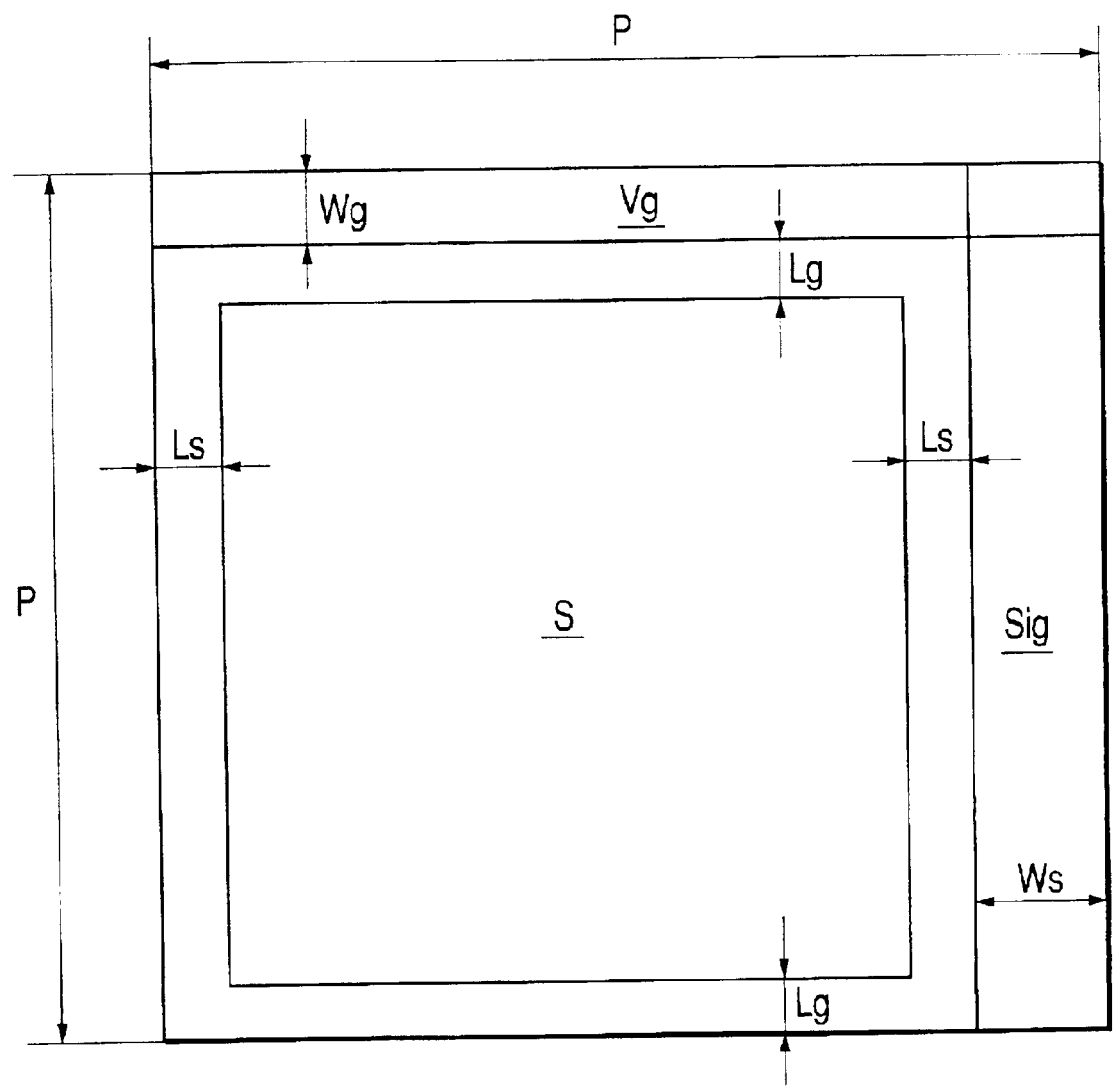
FIG. 12 is a schematic plan view that illustrates an effective aperture ratio of one pixel.
Figure 13:
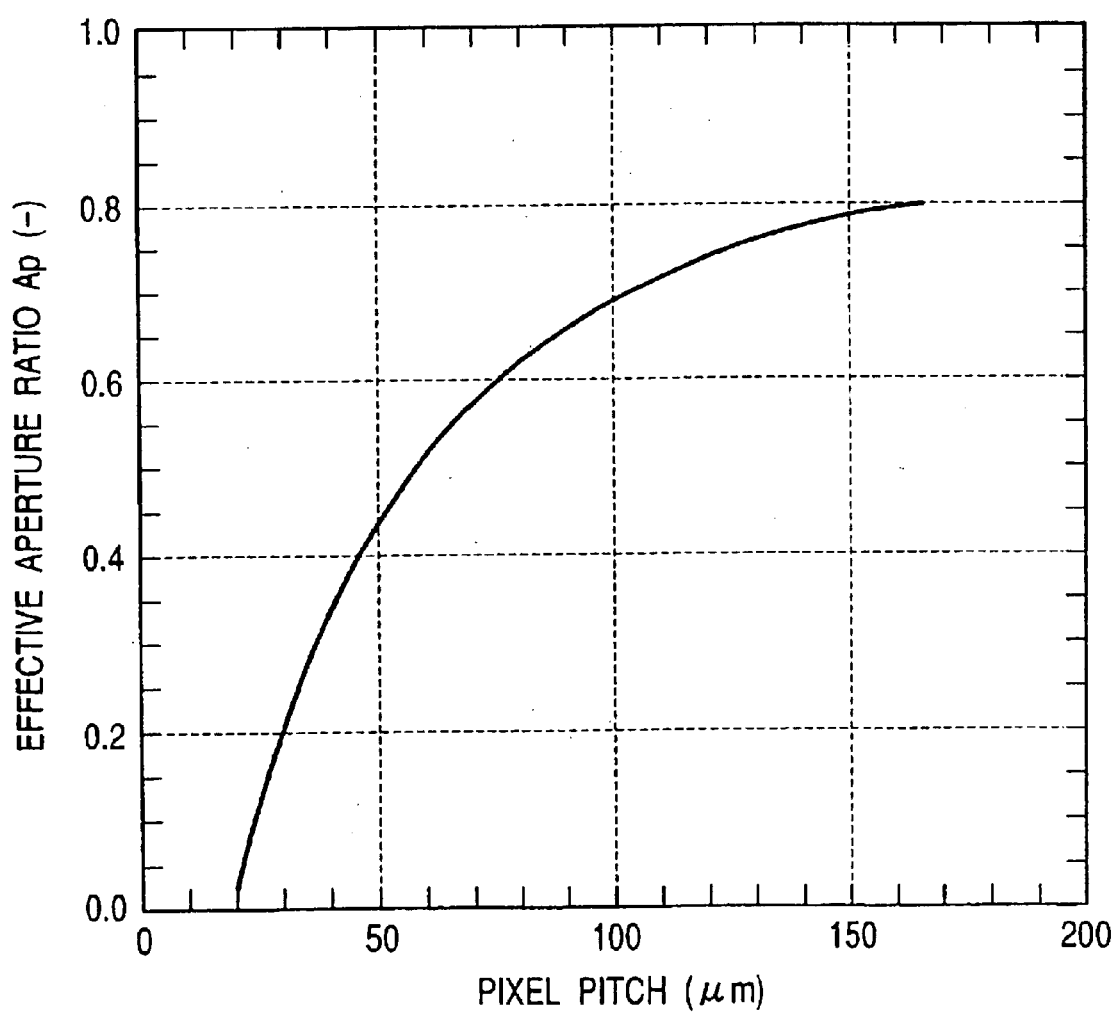
FIG. 13 is a graph showing how an effective aperture ratio changes in accordance with the increase of a pixel pitch of the conventional example.
Figure 14:
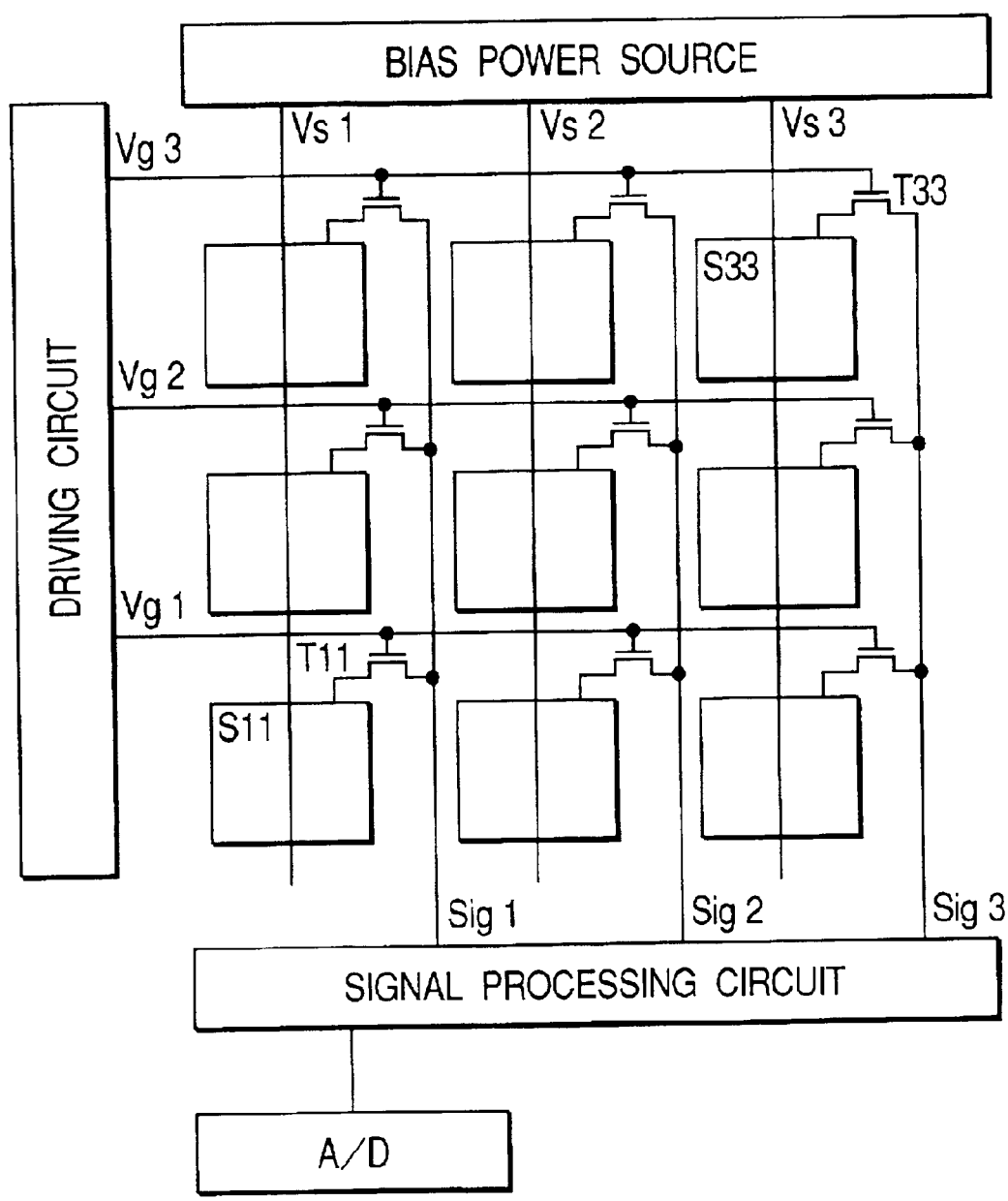
FIG. 14 shows a schematic equivalent circuit of a photosensor array.
Figure 15:
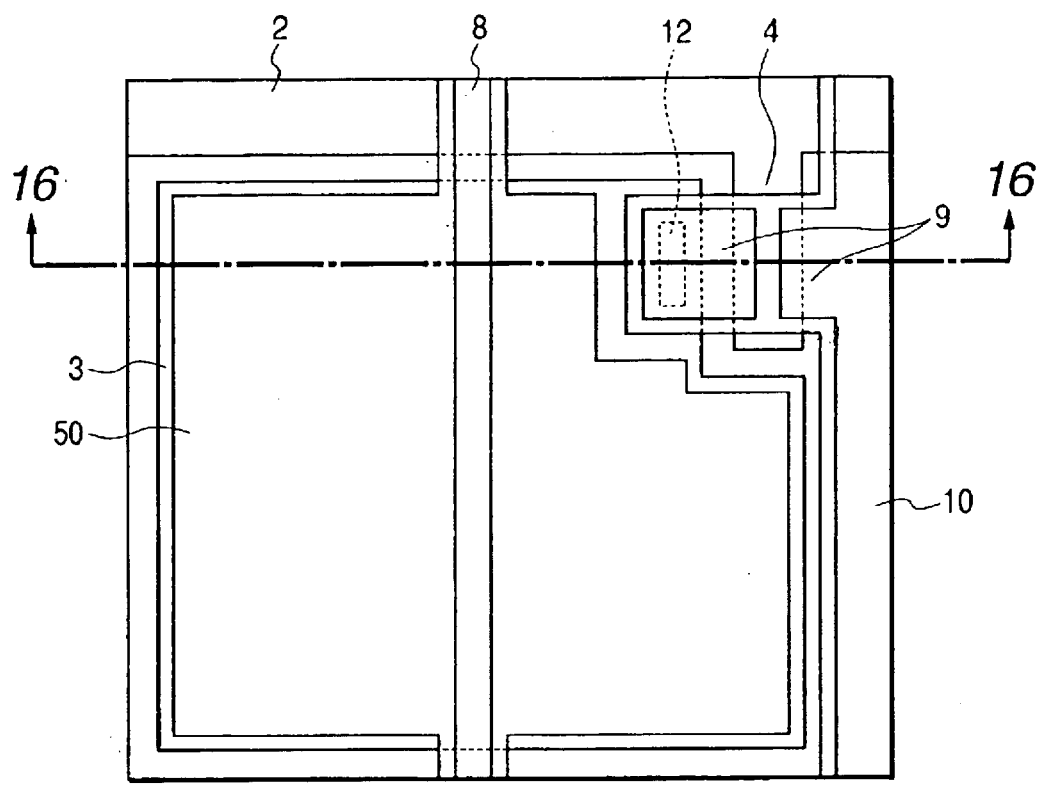
FIG. 15 is a schematic plan view of one pixel of an MIS-TFT structure.
Figure 16:
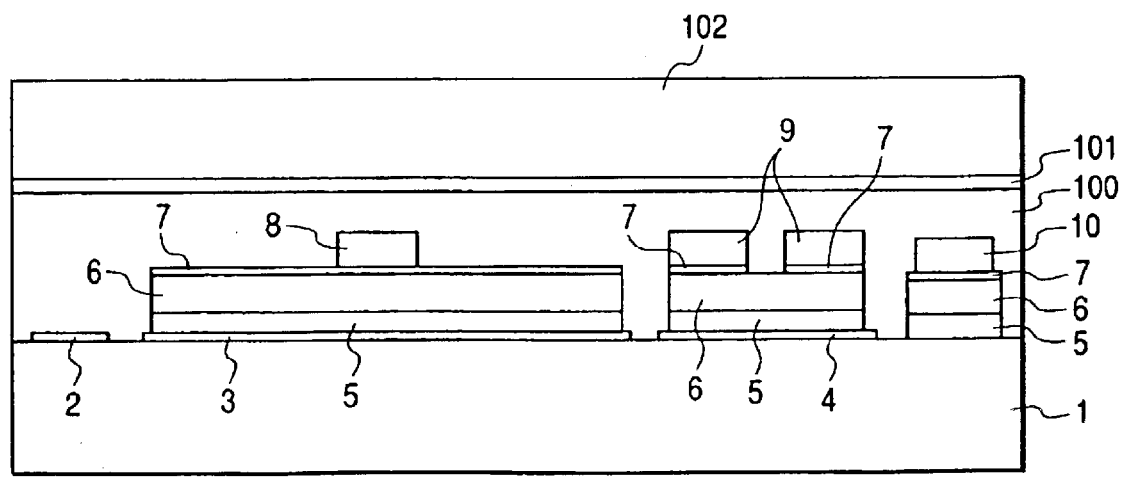
FIG. 16 is a schematic cross-sectional view that illustrates the layer construction of the MIS-TFT structure.

FIGS. 10A and 10B are respectively a schematic construction diagram and a schematic cross-sectional view of the implementation example of the radiation detecting device that is obtained by bonding a phosphor to the photodetecting device according to the present invention and detects radiation such as X-rays.

A plurality of photoelectric conversion elements and a plurality of TFTs are formed within an a-Si (amorphous silicon) sensor substrate 6011, which are connected to a flexible circuit substrate 6010 on which a shift register SR1 and a detecting integrated circuit IC are mounted, and are connected to circuit substrates PCB1 and PCB2 on a side that is opposite to the side on which a-Si of the flexible circuit substrate 6010 is connected. A plurality of a-Si sensor substrates 6011 described above are bonded on a base 6012, thereby constructing a large-sized photodetecting device. Also, a lead plate 6013 is mounted under the base 6012 to protect a memory 6014 within a processing circuit 6018 from X-rays. A phosphor 6030 (CsI, for instance) for converting incident radiation into visible light is evaporated onto the a-Si sensor substrate 6011. As shown in FIG. 10B, all of the construction elements are housed in a case 6020 made of carbon fibers.

FIG. 11 shows an example in which the radiation detecting device described above is applied to an X-ray diagnosis system.

X-rays 6060 generated in an X-ray tube 6050 passes through the chest 6062 of a patient or a subject 6061 and are made incident on a photodetecting device 6040 in the upper section of which a phosphor is mounted. This incident X-rays contain information concerning the inside of the body of the patient 6061. The phosphor emits light in accordance with the incidence of the X-rays and this emitted light is subjected to photoelectric conversion, thereby obtaining electric information. This information is converted into digital information, is subjected to image processing by an image processor 6070, and is observed using a display 6080 installed in a control room.

Also, it is possible to transfer this information to a remote place using a transmission means such as a telephone line 6090. Therefore, it is possible to display the information on a display 6081 installed in a doctor room located at another place or to store the information in a storage means such as an optical disc. This allows a doctor existing at a remote place to conduct diagnosis. Also, it is possible to record the information in a film 6110 using a film processor 6100.

It should be noted here that the radiation means X-rays, α-rays, β-rays, γ-rays, or the like. Also, the light refers to an electromagnetic wave in a wavelength range in which it is possible to detect the electromagnetic wave using a photoelectric conversion element. Further, the light includes visible light.

What is claimed is:

1. A photodetecting device comprising:
   a pixel portion in which a plurality of pixels are disposed two dimensionally on a substrate, wherein each pixel includes a photoelectric conversion element that converts an incident light into an electrical signal, and a switching element corresponding to the photoelectric conversion element;
   a plurality of driving wirings for driving the pixels, wherein the driving wirings are connected to the plurality of switching elements of each row of the pixels;
   a plurality of signal wirings for reading an electric signal generated in the photoelectric conversion elements, wherein the signal wirings are connected to the switching elements of each column of the pixels;
   a plurality of common bias wirings for applying electric charge to the plurality of photoelectric conversion elements, wherein the common bias wirings are connected to the plurality of photoelectric elements; and
   an insulating layer covering the substrate and the pixels,
   wherein each of the signal wirings is disposed on the insulating layer in a gap between adjacent columns of the pixels.

2. A photodetecting device according to claim 1, wherein the width of the gaps is the same or substantially the same as a width of the wiring.

3. A photodetecting device according to claim 1, wherein the width of the gaps is narrower than a width of the wiring.

4. A photodetecting device according to claim 1, wherein the insulating layer contains benzocyclobutene.

5. A photodetecting device according to claim 1, wherein said insulating layer is an organic low permittivity insulating layer.

6. A radiation detecting device comprising:
   a photodetecting device according to claim 1, and a phosphor for converting a radiation into a light disposed on the photodetecting device.

7. A radiation imaging system comprising:
   a radiation detecting device according to claim 6;
   a signal processing means for processing a signal from the radiation detecting device;
   a recording means for recording a signal from the signal processing means;
   a display means for displaying the signal from the signal processing means;
   a transmission processing means for transmitting the signal from the signal processing means; and
   a radiation source for generating radiation.

8. A photodetecting device comprising:
   a pixel portion in which a plurality of pixels are disposed two dimensionally on a substrate, wherein each pixel includes a photoelectric conversion element that converts an incident light into electrical signal, and a switching element corresponding to the photoelectric conversion element;
   a plurality of driving wirings for driving the pixels, each driving wiring being connected to the plurality of switching elements of each row of the pixels, wherein the driving wirings are connected to gate electrodes of the switching elements;
   a plurality of signal wirings for reading an electric signal generated in the photoelectric conversion elements, each signal wiring being connected to switching elements of each column of the pixels, wherein each of the signal wirings is connected to one of source and drain electrodes of each of the switching elements;
   a plurality of common bias wirings for applying electric charge to the plurality of photoelectric conversion elements, the plurality of common bias wirings being connected to the plurality of photoelectric elements; and
   an interlayer insulating layer covering at least the driving wirings,
   wherein the driving wirings and the gate electrodes are arranged separately in different layers sandwiching the interlayer insulating layer, and wherein the driving wirings and the gate electrodes are connected electrically through a contact hole penetrating the interlayer insulating layer.

9. A photodetecting device according to claim 8, wherein each space between a row and an adjacent row of the pixels is substantially the same as a line width of the driving wiring.

10. A photodetecting device according to claim 8, wherein each space between a row and an adjacent row of the pixels is narrower than a line width of the driving wiring, and the driving wiring is formed so as to overlap lower electrodes of adjacent pixels.

11. A photodetecting device according to claim 10, wherein the lower electrode and the gate electrode are formed on the interlayer insulating layer.

12. A photodetecting device according to claim 8, wherein the interlayer insulating layer contains benzocyclobutene.

13. A radiation detecting device comprising:
    a photodetecting device according to claim 8; and
    a phosphor for converting radiation into light provided on the photodetecting device.

14. A radiation imaging system comprising:
    a radiation detecting device according to claim 13,
    a signal processing means for processing a signal from the radiation detecting device;
    a recording means for recording a signal from the signal processing means;
    a display means for displaying the signal from the signal processing means;
    a transmission processing means for transmitting the signal from the signal processing means; and
    a radiation source for generating radiation.

* * * * *

UNITED STATES PATENT AND TRADEMARK OFFICE
CERTIFICATE OF CORRECTION

PATENT NO. : 6,847,039 B2
DATED : January 25, 2005
INVENTOR(S) : Chiori Mochizuki It is certified that error appears in the above-identified patent and that said Letters Patent is hereby corrected as shown below:

Title page,
Item [56] References Cited, OTHER PUBLICATIONS,
"U.S. Appl. No. filed, Sep. 16, 1999, inventor Chiori Mochizuki." should read
-- U.S. Pat. Appl. No. 09/396,880, filed, Sep. 16, 1999, Group Art Unit 2612, Inventor: Chiori Mochizuki. --

Signed and Sealed this

Thirty-first Day of May, 2005

JON W. DUDAS
*Director of the United States Patent and Trademark Office*